(12) United States Patent
Fujie et al.

(10) Patent No.: US 9,985,142 B2
(45) Date of Patent: May 29, 2018

(54) SEMICONDUCTOR DEVICE

(71) Applicant: ROHM CO., LTD., Kyoto (JP)

(72) Inventors: Shusaku Fujie, Kyoto (JP); Masaki Hino, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days. days.

(21) Appl. No.: 15/596,464

(22) Filed: May 16, 2017

(65) Prior Publication Data

US 2017/0338354 A1 Nov. 23, 2017

(30) Foreign Application Priority Data

May 17, 2016 (JP) .................................. 2016-99026

(51) Int. Cl.
*H01L 29/80* (2006.01)
*H01L 29/808* (2006.01)
*H01L 29/40* (2006.01)
*H01L 29/08* (2006.01)
*H01L 29/06* (2006.01)

(52) U.S. Cl.
CPC .......... *H01L 29/808* (2013.01); *H01L 29/063* (2013.01); *H01L 29/0843* (2013.01); *H01L 29/405* (2013.01)

(58) Field of Classification Search
CPC ............... H01L 29/808; H01L 29/0634; H01L 29/0843; H01L 29/402; H01L 29/404; H01L 29/063
USPC ......................................................... 257/256
See application file for complete search history.

(56) References Cited

U.S. PATENT DOCUMENTS

| | | | |
|---|---|---|---|
| 6,455,892 B1 * | 9/2002 | Okuno | .............. H01L 29/66068 257/328 |
| 2014/0061787 A1 * | 3/2014 | Kim | ........................ H01L 29/36 257/339 |

FOREIGN PATENT DOCUMENTS

JP      2015-135844 A    7/2015

* cited by examiner

*Primary Examiner* — Theresa T Doan
(74) *Attorney, Agent, or Firm* — Rabin & Berdo, P.C.

(57) ABSTRACT

A semiconductor device including a semiconductor layer, a drain region formed at a surface region of the semiconductor layer, and a source/gate region including a source region and a gate region, which are alternatively arranged so as to be electrically connected to each other. The device further includes a resistive field plate that is disposed on the semiconductor layer between the drain region and the source/gate region and spirally wound in a top view. The field plate including an innermost peripheral portion electrically connected to the drain region and an outermost peripheral portion electrically connected to ground. An outermost peripheral ground conductor film is disposed on the semiconductor layer between the outermost peripheral portion of the field plate and the source/gate region. Additionally, a second ground conductor film is disposed on the semiconductor layer between the outermost peripheral portion of the field plate and the outermost ground conductor film.

12 Claims, 21 Drawing Sheets

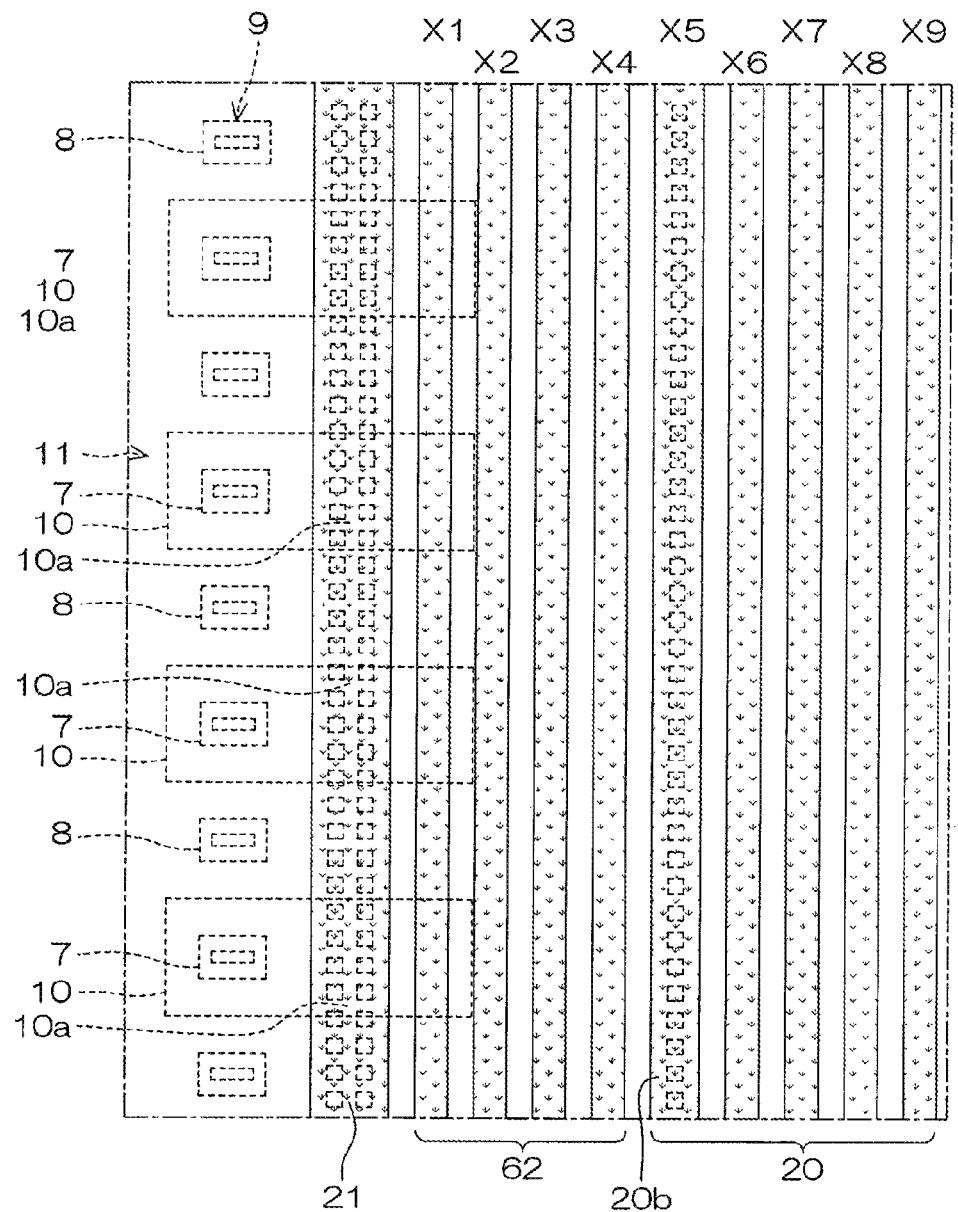

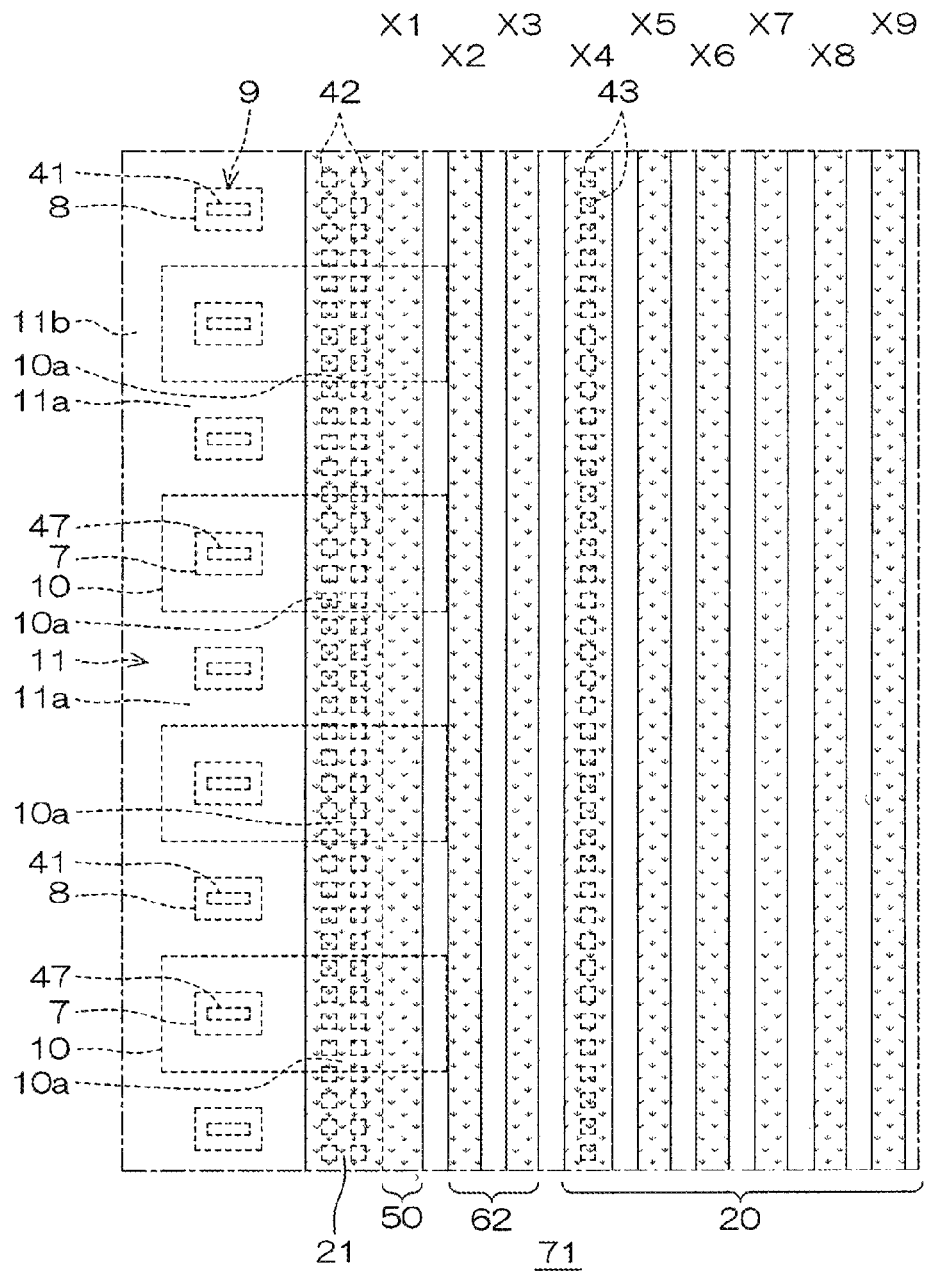

SEMICONDUCTOR DEVICE

CROSS-REFERENCE TO RELATED APPLICATION(S)

This application is based upon and claims the benefit of priority from Japanese Patent Application No. 2016-99026, filed on May 17, 2016, the entire contents of which are incorporated herein by reference.

TECHNICAL FIELD

The present disclosure relates to a semiconductor device including a junction field effect transistor (JFET).

BACKGROUND

Semiconductor devices including junction field effect transistors (JFETs) have been known. Such a semiconductor device includes a p-type semiconductor substrate, an n-type semiconductor region (semiconductor layer) formed on the p-type semiconductor substrate, an n-type drain region formed in the surface layer of the n-type semiconductor region, a plurality of n-type source regions formed at the surface layer of the semiconductor region with a gap between the n-type drain region and the n-type source regions, a p-type gate region formed at the semiconductor region between the source regions, and a resistive field plate which is disposed on the semiconductor region between the drain region and the source regions, is electrically connected to the drain region and the ground, and has a spiral shape in a top view.

In the above semiconductor device including the resistive field plate, unlike a semiconductor device having a field plate in an electrically floating state, a voltage drop occurs in the resistive field plate. It is ideal that a voltage value at the end of the field plate disposed in the vicinity of the source region is 0V. However, in practice, since there is a voltage drop, the voltage value does not become 0V. Therefore, the source regions and/or the gate region formed at the surface region of the semiconductor layer may be affected by the voltage drop of the field plate formed on the semiconductor layer. Then, the source regions are insufficiently depleted, which may result in decrease in the breakdown voltage of the semiconductor device.

The inventors of the present disclosure thought that the above problem might have been resolved since the effect of the voltage drop of the field plate on the source regions and/or the gate region can be reduced when the field plate is disposed at a position spaced from the source regions. However, in this case, it was found that the breakdown voltage is reduced as a result of concentration of an electric field in an empty region between the source regions and the field plate.

SUMMARY

The present disclosure provides some embodiments of a semiconductor device capable of increasing the breakdown voltage in a structure in which a resistive field plate is interposed between a drain region and a source region.

According to an aspect of the present disclosure, there is provided a semiconductor device including a semiconductor substrate of a first conductivity type; a semiconductor layer of a second conductivity type, which is formed on the semiconductor substrate; a drain region of the second conductivity type, which is formed at a surface region of the semiconductor layer; a source/gate region including a source region of the second conductivity type and a gate region of the first conductivity type, which are alternatively arranged so as to be electrically connected to each other at the surface region of the semiconductor layer, the source/gate region being formed around the drain region at a distance so as to surround the drain region; a resistive field plate disposed on the semiconductor layer between the drain region and the source/gate region and spirally wound a plurality of times in a top view, the field plate including an innermost peripheral portion electrically connected to the drain region and an outermost peripheral portion electrically connected to ground; an outermost peripheral ground conductor film disposed on the semiconductor layer between the outermost peripheral portion of the field plate and the source/gate region so as to surround the field plate, the outermost peripheral ground conductor film being electrically connected to ground and having an annular shape in a top view; and a second ground conductor film disposed on the semiconductor layer between the outermost peripheral portion of the field plate and the outermost peripheral ground conductor film so as to surround the field plate, the second ground conductor film being electrically connected to ground and having an annular shape in a top view.

According to another aspect of the present disclosure, there is provided a semiconductor device including a semiconductor substrate of a first conductivity type; a semiconductor layer of a second conductivity type, which is formed on the semiconductor substrate; a drain region of the second conductivity type, which is formed at a surface region of the semiconductor layer; a source/gate region including a source region of the second conductivity type and a gate region of the first conductivity type, which are alternatively arranged so as to be electrically connected to each other at the surface region of the semiconductor layer, the source/gate region being formed around the drain region at a distance so as to surround the drain region; a resistive field plate disposed on the semiconductor layer between the drain region and the source/gate region and spirally wound a plurality of times in a top view, the field plate including an innermost peripheral portion electrically connected to the drain region and an outermost peripheral portion electrically connected to ground; an outermost peripheral ground conductor film disposed on the semiconductor layer between the outermost peripheral portion of the field plate and the source/gate region so as to surround the field plate, the outermost peripheral ground conductor film being electrically connected to ground and having an annular shape in a top view; and a floating conductor film disposed on the semiconductor layer between the outermost peripheral portion of the field plate and the outermost peripheral ground conductor film so as to surround the field plate, the floating conductor film being in an electrically floating state and having an annular shape in a top view.

BRIEF DESCRIPTION OF THE DRAWINGS

FIG. 10C illustrates a plan view of a portion corresponding to FIG. 9, showing a fourth adjustment example for the layout of the floating conductor film.

FIG. 13 illustrates an enlarged plan view of a portion in a region in which the field plate is disposed in a semiconductor device according to a modification example.

DETAILED DESCRIPTION

Embodiments of the present disclosure are described below in detail with reference to the drawings.

First Embodiment

Figure 1A:
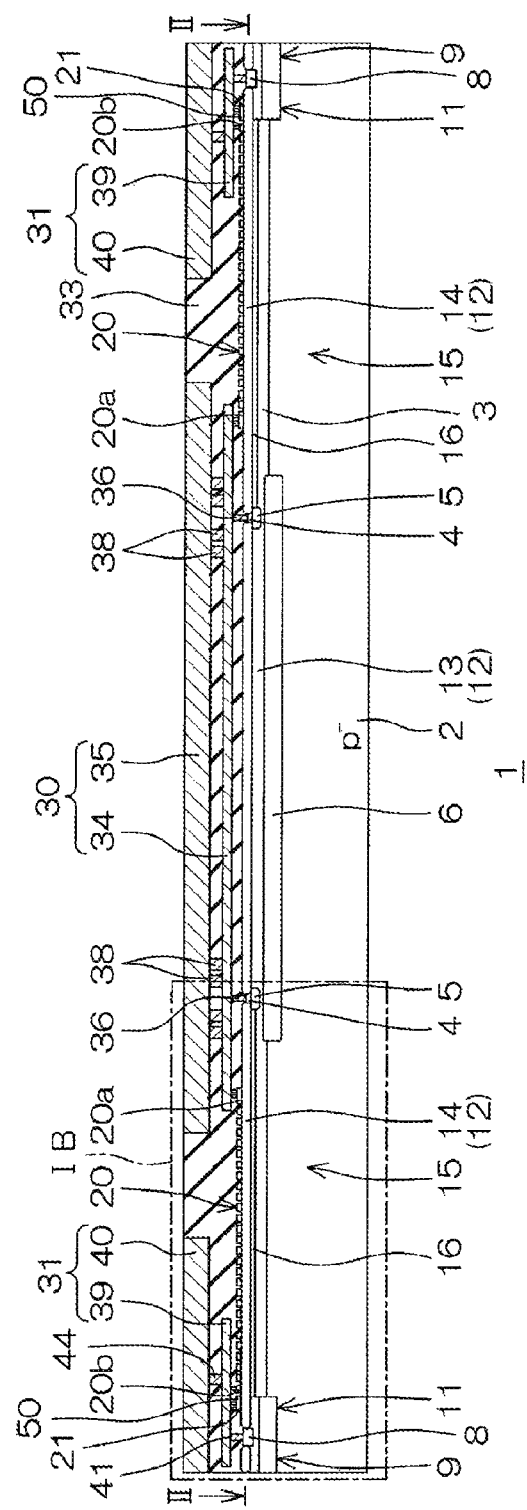
FIG. 1A schematically illustrates a longitudinal sectional view of a semiconductor device according to a first embodiment of the present disclosure.
Figure 1B:
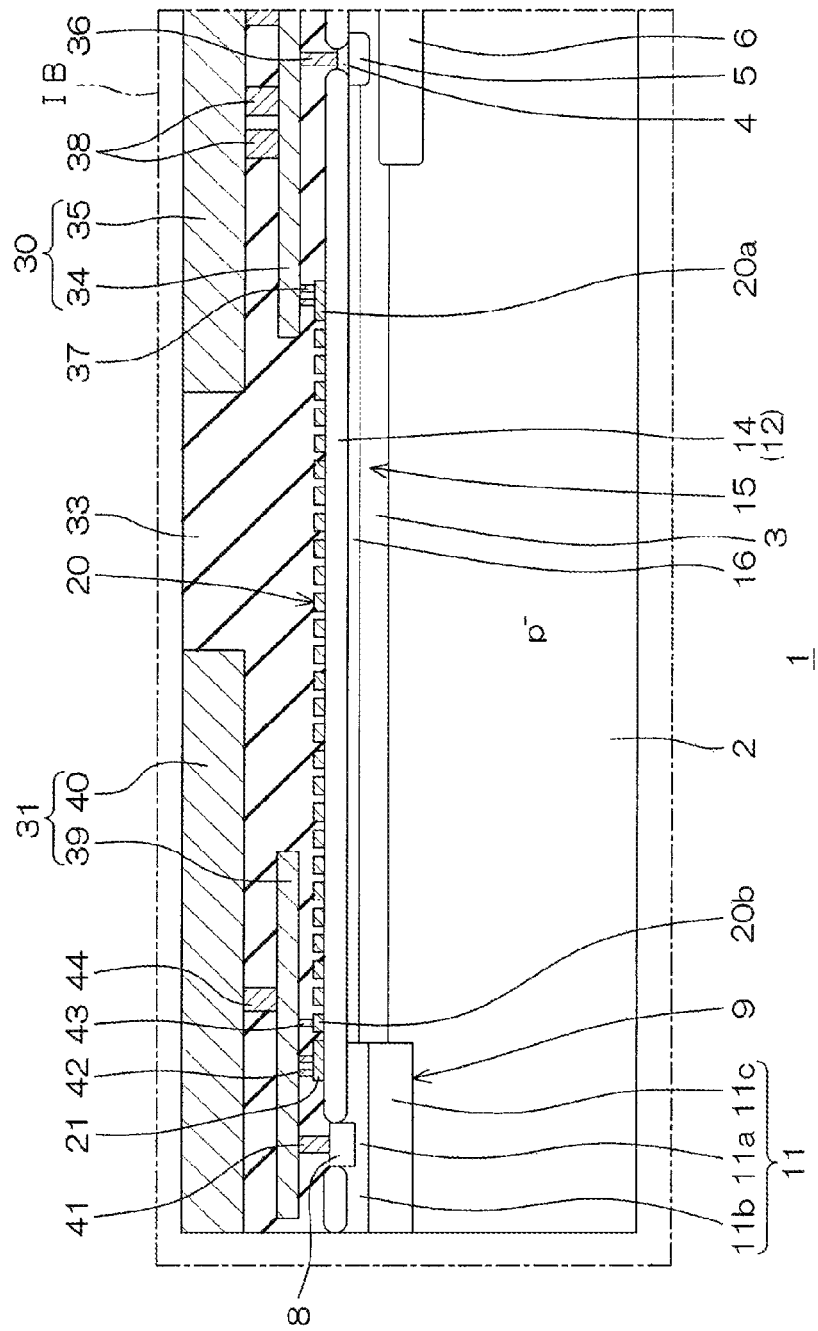
FIG. 1B depicts an enlarged sectional view of a portion surrounded by a broken line IB in FIG. 1A.
Figure 2:
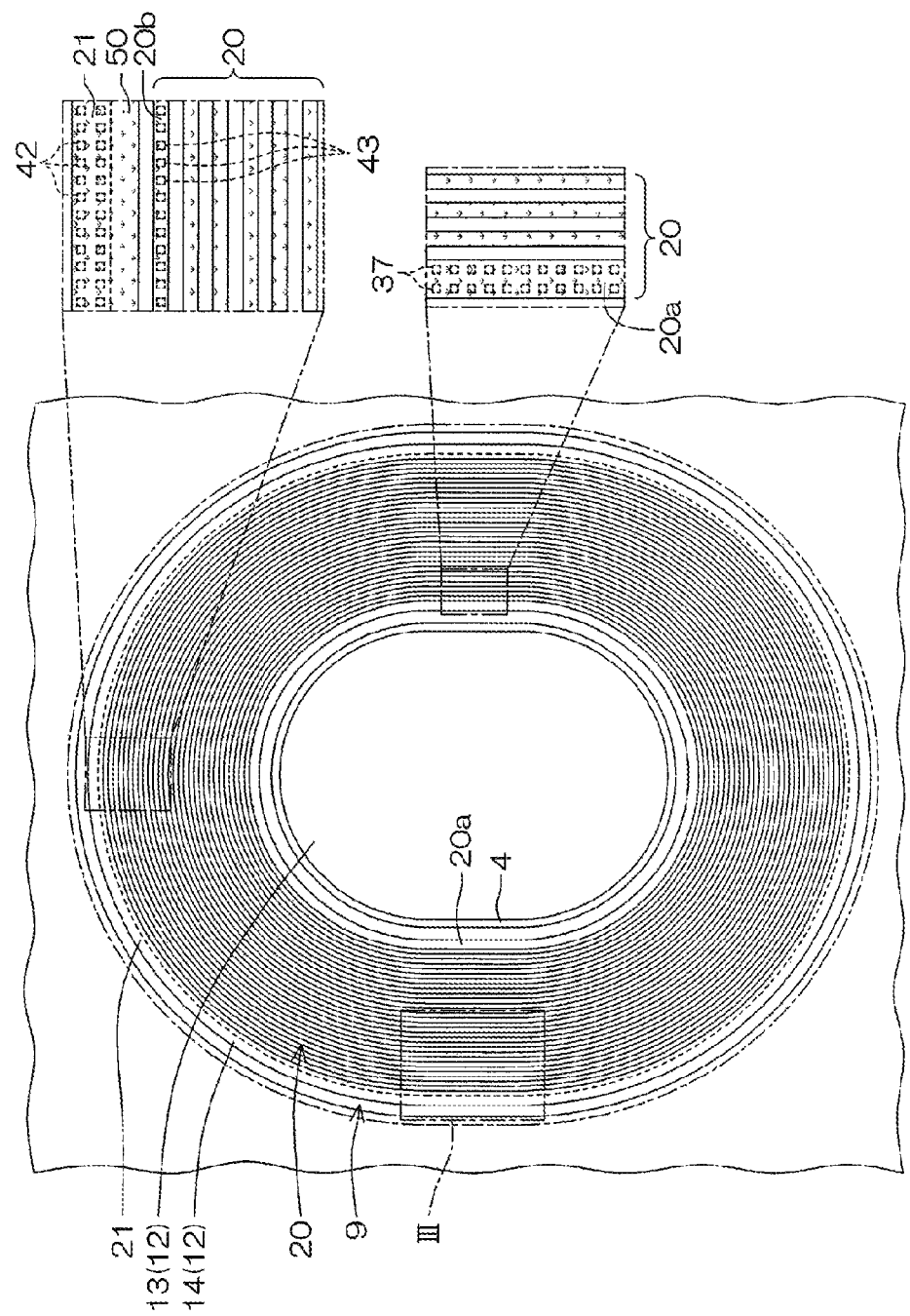
FIG. 2 illustrates a cross-sectional view taken along a line II-II in FIG. 1A.
Figure 3:
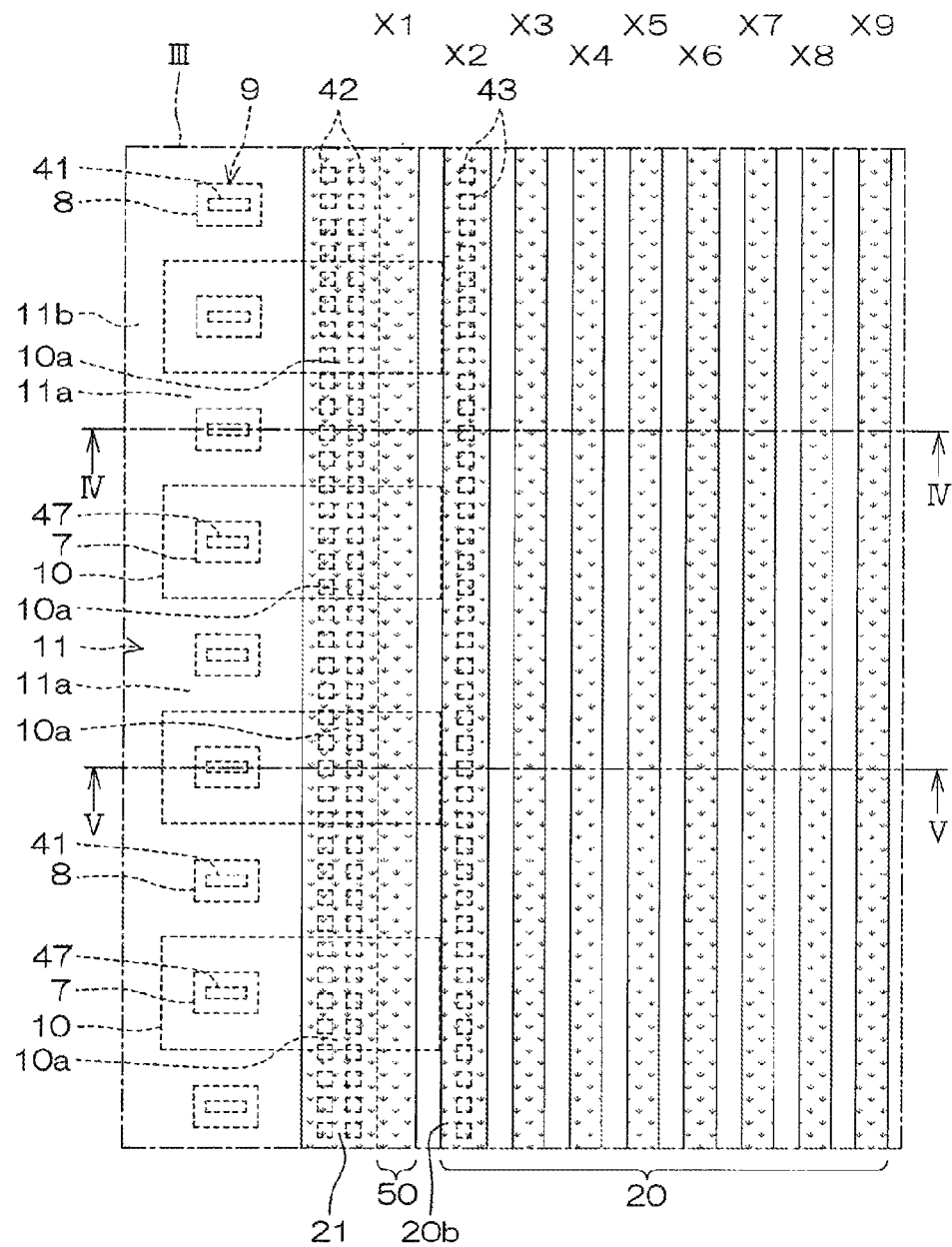
FIG. 3 depicts an enlarged plan view of a portion surrounded by a broken line III in FIG. 2, showing a first adjustment example for a layout of a second ground conductor film.
Figure 4:
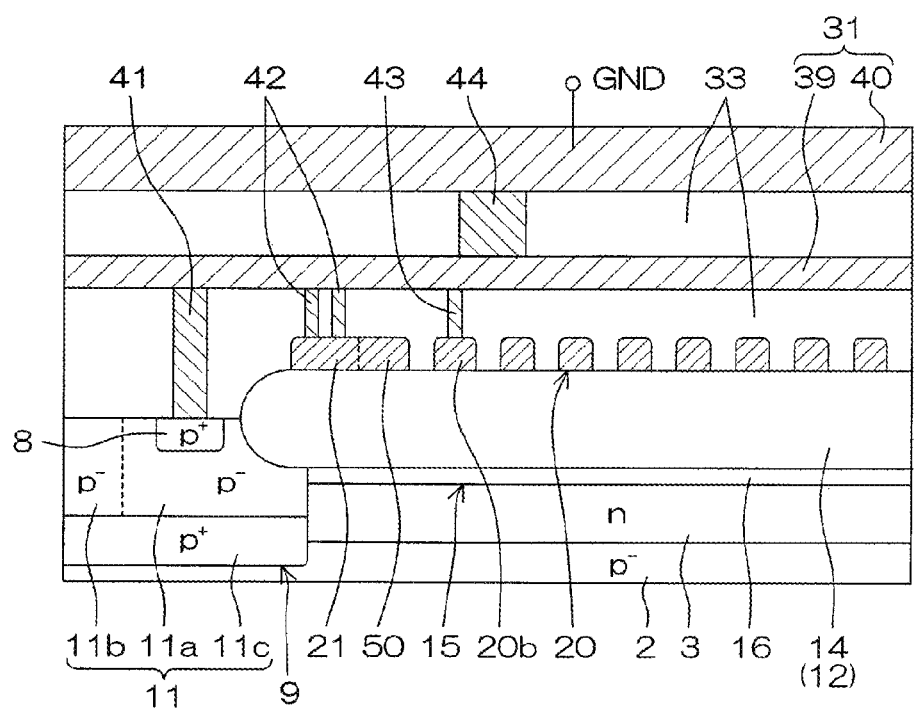
FIG. 4 illustrates a longitudinal sectional view taken along a line IV-IV in FIG. 3.
Figure 5:
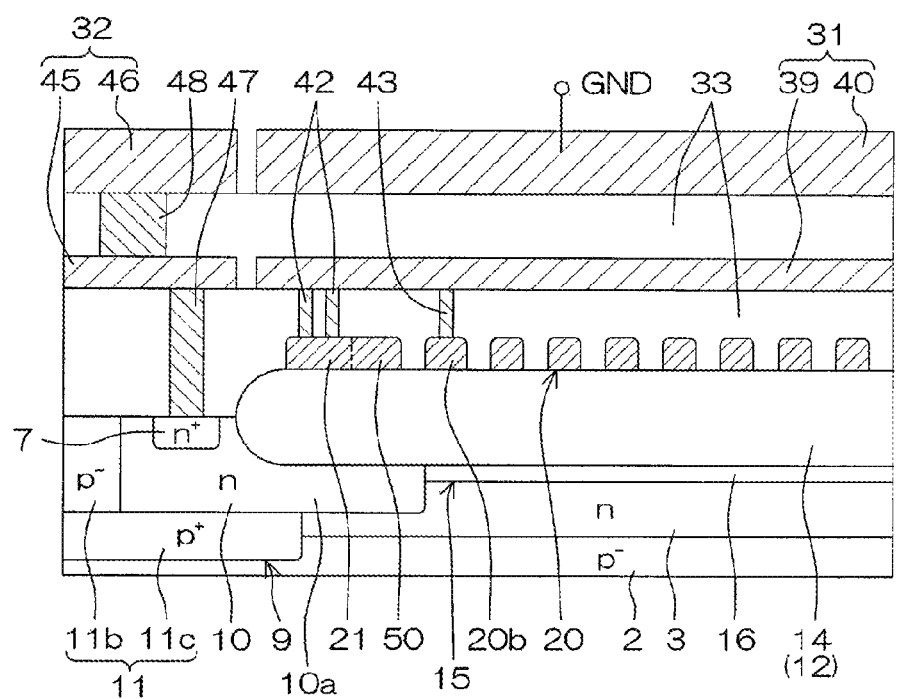
FIG. 5 illustrates a longitudinal sectional view taken along a line V-V in FIG. 3.

FIG 1A schematically illustrates a longitudinal sectional view of a semiconductor device 1 according to a first embodiment of the present disclosure. FIG. 1B depicts an enlarged sectional view of a portion surrounded by a broken line IB in FIG. 1A. FIG. 2 illustrates a cross-sectional view taken along a line II-II in FIG. 1A. FIG. 3 depicts an enlarged plan view of a portion surrounded by a broken line III in FIG. 2, showing a first adjustment example for a layout of a second ground conductor film 50, which is to be described later. FIG. 4 illustrates a longitudinal sectional view taken along a line IV-IV in FIG. 3. FIG. 5 illustrates a longitudinal sectional view taken along a line V-V in FIG. 3.

The semiconductor device 1 is a semiconductor device including a junction field effect transistor (JFET) having a drain-source voltage VDS, for example, between 500V and 1500V (about 800V in the present embodiment). The semiconductor device 1 includes a p-type semiconductor substrate 2 and an n-type epitaxial layer 3 as an example of a semiconductor layer formed on the semiconductor substrate 2. The semiconductor substrate 2 is, for example, a high resistance silicon substrate whose p-type impurity concentration is set to a relatively low value. The p-type impurity concentration of the semiconductor substrate 2 is, for example, between $1.0 \times 10^{13}$ cm$^{-3}$ and $1.0 \times 10^{14}$ cm$^{-3}$. The n-type impurity concentration of the epitaxial layer 3 is, for example between $1.0 \times 10^{15}$ cm$^{-3}$ and $1.0 \times 10^{16}$ cm$^{-3}$. The thickness of the epitaxial layer 3 is, for example, between 1 μm and 10 μm. A drain region 4 is formed at a surface region of the epitaxial layer 3.

The drain region 4 is formed in an oval annular shape in a top view. The drain region 4 has an n-type impurity concentration higher than the n-type impurity concentration of the epitaxial layer 3. The n-type impurity concentration of the drain region 4 is, for example between $1.0 \times 10^{19}$ cm$^{-3}$ and $1.0 \times 10^{20}$ cm$^{-3}$. An n-type drain side well region 5 is formed at the surface region of the epitaxial layer 3 below the drain region 4.

The drain side well region 5 covers a bottom portion and a side portion of the drain region 4 and is formed in an oval annular shape along the drain region 4 in a top view. The drain side well region 5 has an n-type impurity concentration higher than the n-type impurity concentration of the epitaxial layer 3 and lower than the n-type impurity concentration of the drain region 4. The n-type impurity concentration of the drain side well region 5 is, for example, between $1.0 \times 10^{16}$ cm$^{-3}$ and $1.0 \times 10^{17}$ cm$^{-3}$. An n-type drain buffer region 6 is formed at the epitaxial layer 3 below the drain side well region 5.

The drain buffer region 6 is formed in the semiconductor substrate 2 and the epitaxial layer 3 so as to traverse the boundary between the semiconductor substrate 2 and the epitaxial layer 3, and forms a p-n junction with the semiconductor substrate 2. The breakdown voltage of the semiconductor device 1 is increased by forming a p-n junction between the drain buffer region 6 and the semiconductor substrate 2. The drain buffer region 6 is formed in an oval shape in a top view and has a peripheral edge that is led out beyond an outer peripheral edge of the drain region 4. The drain buffer region 6 has an n-type impurity concentration higher than the n-type impurity concentration of the drain side well region 5 and lower than the n-type impurity concentration of the drain region 4. The n-type impurity concentration of the drain buffer region 6 is, for example, between $1.0 \times 10^{18}$ cm$^{-3}$ and $1.0 \times 10^{19}$ cm$^{-3}$.

Referring to FIGS. 3 to 5, a source/gate region 9 including one or more n-type source regions 7 and one or more p-type gate regions 8, which are alternately arranged at intervals so as to be electrically connected to each other, is formed at the surface region of the epitaxial layer 3. The source regions 7 are in an electrically floating state and the gate regions 8 are electrically connected to ground. The source/gate region 9 is formed around the drain region 4 at a predetermined interval so as to surround the drain region 4. In the present embodiment, the source/gate region 9 is formed in an oval annular shape in a top view so as to surround the drain region 4 with a predetermined interval therebetween.

In the source/gate region 9, each of the source regions 7 is formed in a square shape in a top view and has an n-type impurity concentration substantially that is the same as the n-type impurity concentration of the drain region 4. In addition, each of the gate regions 8 is formed in a square shape in a top view and has a p-type impurity concentration that is higher than the p-type impurity concentration of the semiconductor substrate 2. The p-type impurity concentration of the gate regions 8 is, for example, between $1.0 \times 10^{19}$ $cm^{-3}$ and $1.0 \times 10^{20}$ $cm^{-3}$.

Referring to FIGS. 3 to 5, the source/gate region 9 includes one or more n-type source side well regions 10 formed at the surface region of the epitaxial layer 3 below the source regions 7, and a p-type gate side well region 11 formed at the surface region of the epitaxial layer 3 below the gate regions 8.

The source side well regions 10 cover bottom portions and side portions of the source regions 7 and are intermittently formed so as to surround the source regions 7 one by one in a top view. Each of the source side well regions 10 has an overhang portion 10a protruding toward the drain region 4 from the gate side well region 11 and is formed in a square shape in a top view. The bottom portions of the source side well regions 10 are located in the epitaxial layer 3. Each of the source side well regions 10 has an n-type impurity concentration that is substantially the same as the n-type impurity concentration of the drain side well region 5. Therefore, the n-type impurity concentration of the source side well regions 10 is lower than the n-type impurity concentration of the source regions 7.

On the other hand, the gate side well region 11 covers the bottom portions and side portions of the gate regions 8 and is formed at the epitaxial layer 3 so as to be in contact with three side portions and a bottom portion of each of the source side well regions 10 except the overhang portion 10a. The gate side well region 11 forms a p-n junction with the three side portions and the bottom portion of each of the source side well regions 10 except the overhang portion 10a.

More specifically, the gate side well region 11 includes one or more first regions 11a covering the bottom portions and the side portions of the gate regions 8 between adjacent source side well regions 10, a second region 11b connecting adjacent first regions 11a on the opposite side to the overhang portions 10a of the source side well regions 10, and a third region 11c formed below the first regions 11a and the second region 11b and in contact with the bottom portions of the source side well regions 10.

In the present embodiment, the first regions 11a and the second region 11b of the gate side well region 11 are formed to have an identical p-type impurity concentration, and the third region 11c of the gate side well region 11 is formed with a p-type impurity concentration higher than the p-type impurity concentration of the first regions 11a and second region 11b. The p-type impurity concentration of the first regions 11a and second region 11b is, for example, between $1.0 \times 10^{17}$ $cm^{-3}$ and $1.0 \times 10^{18}$ $cm^{-3}$. The p-type impurity concentration of the third region 11c is, for example, between $1.0 \times 10^{18}$ $cm^{-3}$ and $1.0 \times 10^{19}$ $cm^{-3}$.

Each of the first regions 11a of the gate side well region 11 has a bottom portion located within the epitaxial layer 3 and is formed in a square shape in a top view. The second region 11b of the gate side well region 11 has a bottom portion located within the epitaxial layer 3 and is formed in an oval annular shape in a top view. The third region 11c of the gate side well region 11 is formed within the semiconductor substrate 2 and the epitaxial layer 3 so as to traverse the boundary of the semiconductor substrate 2 and the epitaxial layer 3.

The bottom portion of the third region 11c of the gate side well region 11 is located within the semiconductor substrate 2. The third region 11c of the gate side well region 11 is formed in an oval annular shape in a top view so as to be in contact with the bottom portions of the source side well regions 10 in addition to the bottom portions of the first regions 11a and the second region 11b. In this manner, the gate side well region 11 forms a p-n junction with the side portions and the bottom portion of each of the source side well regions 10 except the overhang portion 10a.

A current flowing between the drain region 4 and the source regions 7 is controlled by a predetermined control voltage applied to the source/gate region 9. More specifically, when a predetermined control voltage is applied to the source regions 7, a depletion layer expands from the p-n junction between the source side well regions 10 and the gate side well region 11, and the source regions 7 and the source side well regions 10 are depleted. As a result, since a current path between the drain region 4 and the source regions 7 is closed, no current flows between the drain region 4 and the source regions 7.

On the contrary, when the application of the control voltage to the source regions 7 is cancelled, the depletion of the source regions 7 and the source side well regions 10 is released. Thus, since the current path between the drain region 4 and the source regions 7 is opened, a current flows between the drain region 4 and the source regions 7. In this manner, the current flowing between the drain region 4 and the source regions 7 is controlled.

On the surface of the epitaxial layer 3, a local oxidation-of-silicon (LOCOS) film 12 is formed as an example of an insulating film for selectively exposing the drain region 4 and the source/gate region 9. The LOCOS film 12 includes an inner LOCOS film 13 having an oval shape in a top view to cover a region surrounded by the drain region 4, and an outer LOCOS film 14 having an oval annular shape in a top view to cover a region between the drain region 4 and the source/gate region 9. The outer LOCOS film 14 is formed so as to cover the overhang portions 10a of the source side well regions 10 and an end portion of the gate side well region 11 at the closer side to the drain region 4.

A region from an inner peripheral edge to an outer peripheral edge of the outer LOCOS film 14 on the epitaxial layer 3 corresponds to a drift region 15, and the distance of the drift region 15 is, for example, between 80 μm and 200 μm (about 120 μm in the present embodiment). The thickness of the LOCOS film 12 is, for example, between 5,000 Å and 15,000 Å (about 8,000 Å in the present embodiment).

A p-type re-surf (reduced surface) layer 16 is formed at a portion of the epitaxial layer 3 in contact with the outer LOCOS film 14. The re-surf layer 16 is formed in an oval annular shape in a top view so as to extend along the outer LOCOS film 14 and forms a p-n junction with the epitaxial layer 3. The p-type impurity concentration of the re-surf layer 16 is higher than the p-type impurity concentration of the semiconductor substrate 2. The p-type impurity concentration of the re-surf layer 16 is, for example, between $1.0 \times 10^{15}$ $cm^{-3}$ and $1.0 \times 10^{16}$ $cm^{-3}$.

A resistive field plate 20 is disposed on the outer LOCOS film 14. The field plate 20 is interposed between the drain region 4 and the source/gate region 9 and has a structure spirally wound a plurality of times in a top view. The field plate 20 is wound around the drain region 4 at an equal winding pitch from the drain region 4 toward the source/gate region 9. Specifically, the winding pitch refers to a width between a portion of the field plate 20 positioned on an inner side and a portion of the field plate 20 located on an outer side in a direction orthogonal to the extending direction of the field plate 20.

The field plate 20 includes an innermost peripheral portion 20a disposed on the side closer to the drain region 4 and electrically connected to the drain region 4, and an outermost peripheral portion 20b disposed on the side closer to the source/gate region 9 and electrically connected to ground. The field plate 20 functions as a resistor film having a predetermined resistance value between the drain region 4 and ground. The resistance value of the field plate 20 is, for example, between 20 MΩ and 100 MΩ (about 50 MΩ in the present embodiment). The innermost peripheral portion 20a of the field plate 20 is a portion where the field plate 20 does not exist in a more inner side and the outermost peripheral portion 20b of the field plate 20 is a portion where the field plate 20 does not exist in a more outer side.

The field plate 20 includes polysilicon to which conductivity is imparted, for example, by impurity doping. The impurity added to the polysilicon may be phosphorus. In this configuration, the innermost peripheral portion 20a and the outermost peripheral portion 20b of the field plate 20 may have a higher impurity concentration than other portions. According to this configuration, it is possible to reduce the resistance value of the innermost peripheral portion 20a electrically connected to the drain region 4 and the resistance value of the outermost peripheral portion 20b electrically connected to ground.

The resistive field plate 20 can be used to detect the voltage between the drain region 4 and the source regions 7 and the current flowing between the drain region 4 and the source regions 7 by detecting the voltage drop of the field plate 20 and the current flowing through the field plate 20. As such, the resistive field plate 20 has its inherent ability of suppressing the disturbance of an electric field and suppressing the concentration of a local electric field in the epitaxial layer 3 and so on, and further the ability of detecting a current. Therefore, it is possible to adjust a control voltage for the source/gate region 9 or to adjust a method of controlling the semiconductor device 1 based on a voltage value and a current value detected using the field plate 20, which makes it possible to effectively enhance the versatility and the convenience of the semiconductor device 1.

An outermost peripheral ground conductor film 21 electrically connected to ground is disposed in a region between the source/gate region 9 on the outer LOCOS film 14 and the outermost peripheral portion 20b of the field plate 20. The outermost peripheral ground conductor film 21 has an annular shape in a top view to surround the field plate 20. The outermost peripheral ground conductor film 21 is electrically connected to the gate regions 8, but is separated from the field plate 20 without being mechanically connected to the field plate 20.

The outermost peripheral ground conductor film 21 traverses and overlaps the overhang portions 10a of the source side well regions 10 in a top view. The outermost peripheral ground conductor film 21 includes polysilicon to which conductivity is imparted by impurity doping. The outermost peripheral ground conductor film 21 may be formed with the same impurity concentration as those of the innermost peripheral portion 20a and the outermost peripheral portion 20b of the field plate 20.

Referring to FIGS. 1A, 1B, 4, and 5, disposed on the epitaxial layer 3 are a drain metal 30 electrically connected to the drain region 4, a gate metal 31 electrically connected to the gate region 8, and a source metal 32 electrically connected to the source region 7. In addition, a plurality of interlayer insulating films 33 is stacked on the epitaxial layer 3. Further, the drain metal 30, the gate metal 31, and the source metal 32 are selectively formed in the interlayer insulating films 33.

The drain metal 30 has a laminated structure including a first drain metal 34 disposed on the drain region 4 and a second drain metal 35 disposed on the first drain metal 34. The first drain metal 34 is disposed to face the drain region 4 and the innermost peripheral portion 20a of the field plate 20. The first drain metal 34 is electrically connected to the drain region 4 via a first contact 36 and is electrically connected to the innermost peripheral portion 20a of the field plate 20 via a second contact 37. The second drain metal 35 is electrically connected to the first drain metal 34 via a third contact 38.

The gate metal 31 has a laminated structure including a first gate metal 39 disposed on the gate region 8 and a second gate metal 40 disposed on the first gate metal 39. The first gate metal 39 is disposed to face the gate region 8, the outermost peripheral ground conductor film 21, and the outermost peripheral portion 20b of the field plate 20.

The first gate metal 39 is electrically connected to the gate region 8 via a fourth contact 41, is electrically connected to the outermost peripheral ground conductor film 21 via a fifth contact 42, and is electrically connected to the outermost peripheral portion 20b of the field plate 20 via a sixth contact 43. The second gate metal 40 is electrically connected, for example, to a ground electrode (not shown) for providing a ground electric potential, and is electrically connected to the first gate metal 39 via a seventh contact 44. As a result, the gate region 8, the outermost peripheral portion 20b of the field plate 20, and the outermost peripheral ground conductor film 21 have an identical electric potential (e.g., ground electric potential).

As such, in the present embodiment, the gate metal 31 (or the first gate metal 39) is a connection member that commonly connects the gate region 8, the outermost peripheral portion 20b of the field plate 20, and the outermost peripheral ground conductor film 21 on the epitaxial layer 3 such that they have an identical electric potential (e.g., ground electric potential).

The source metal 32 has a laminated structure including a first source metal 45 disposed on the source region 7 and a second source metal 46 disposed on the first source metal 45. The first source metal 45 is disposed to face the source region 7. The first source metal 45 is electrically connected to the source region 7 via an eighth contact 47. The second source metal 46 is electrically connected to the first source metal 45 via a ninth contact 48. The second source metal 46 is in an electrically floating state when it is in a normal state. When a predetermined control voltage is applied to the second source metal 46, a flow of the current between the drain region 4 and the source region 7 is controlled.

Referring to FIGS. 3 to 5, the semiconductor device 1 according to the present embodiment is characterized in that the second ground conductor film 50 electrically connected to ground is interposed in a predetermined manner between the outermost peripheral portion 20b of the field plate 20 and the outermost peripheral ground conductor film 21 on the outer LOCOS film 14. As such, the second ground conductor film 50 has an electric potential (e.g., ground electric potential) that is identical to that of the gate regions 8, the outermost peripheral portion 20b of the field plate 20, and the outermost peripheral ground conductor film 21. The present embodiment can increase the breakdown voltage of the semiconductor device 1 by the second ground conductor film 50.

The second ground conductor film 50 is formed between the outermost peripheral portion 20b of the field plate 20 and the outermost peripheral ground conductor film 21 so as to surround the field plate 20 in an oval annular shape in a top view. The second ground conductor film 50 traverses and overlaps the overhang portions 10a of the source side well regions 10 in a top view. In the present embodiment, the second ground conductor film 50 is formed integrally with the outermost peripheral ground conductor film 21 along the inner periphery of the outermost peripheral ground conductor film 21. In this manner, the second ground conductor film 50 has the same electric potential as the outermost ground conductor film 21 and the like.

In the above configuration, the boundary between the epitaxial layer 3 and the overhang portions 10a of the source side well regions 10 is located in a region between the inner peripheral edge of the second ground conductor film 50 and the outermost peripheral portion 20b of the field plate 20. Therefore, the outermost peripheral portion 20b of the field plate 20 is disposed closer to the drain region 4 than the boundary between the epitaxial layer 3 and the overhang portions 10a of the source side well regions 10.

Figure 6A:
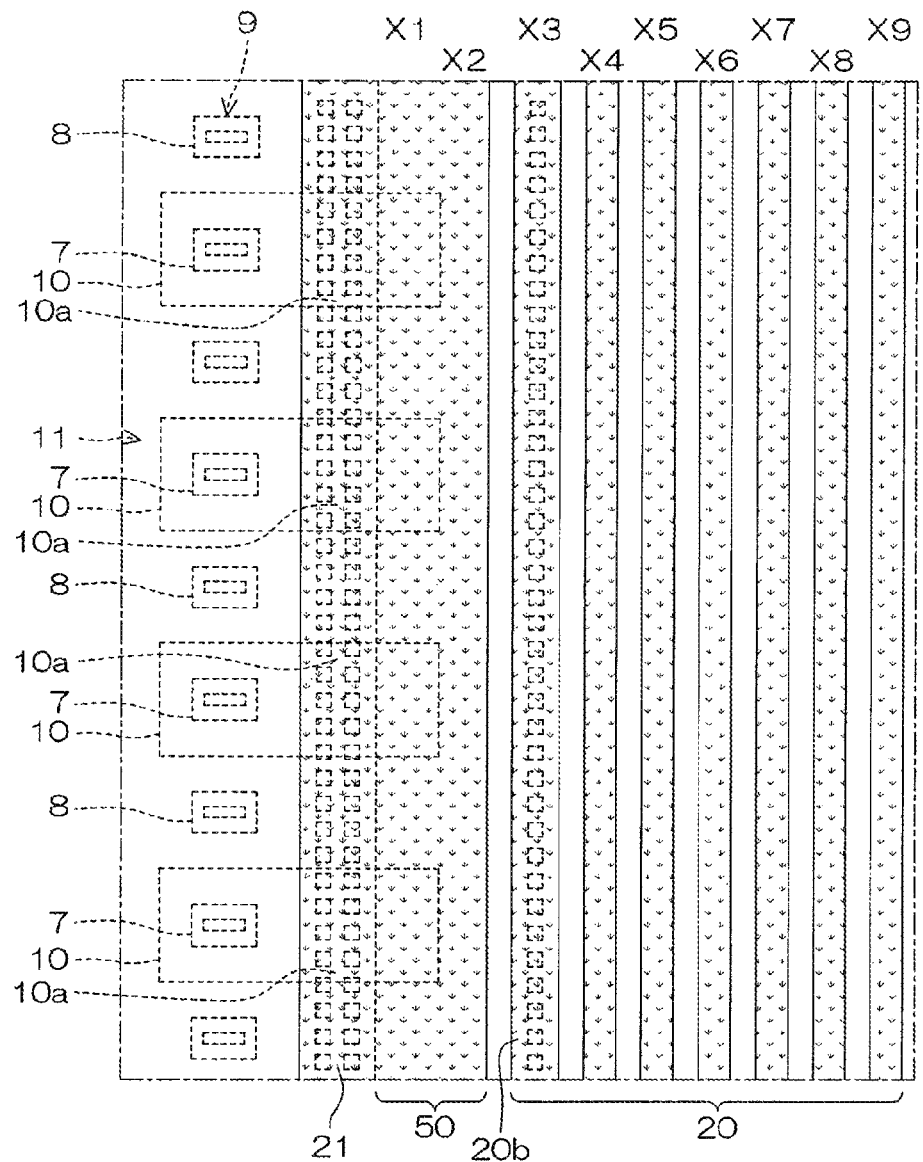
FIG. 6A illustrates a plan view of a portion corresponding to FIG. 3, showing a second adjustment example for the layout of the second ground conductor film.
Figure 6B:
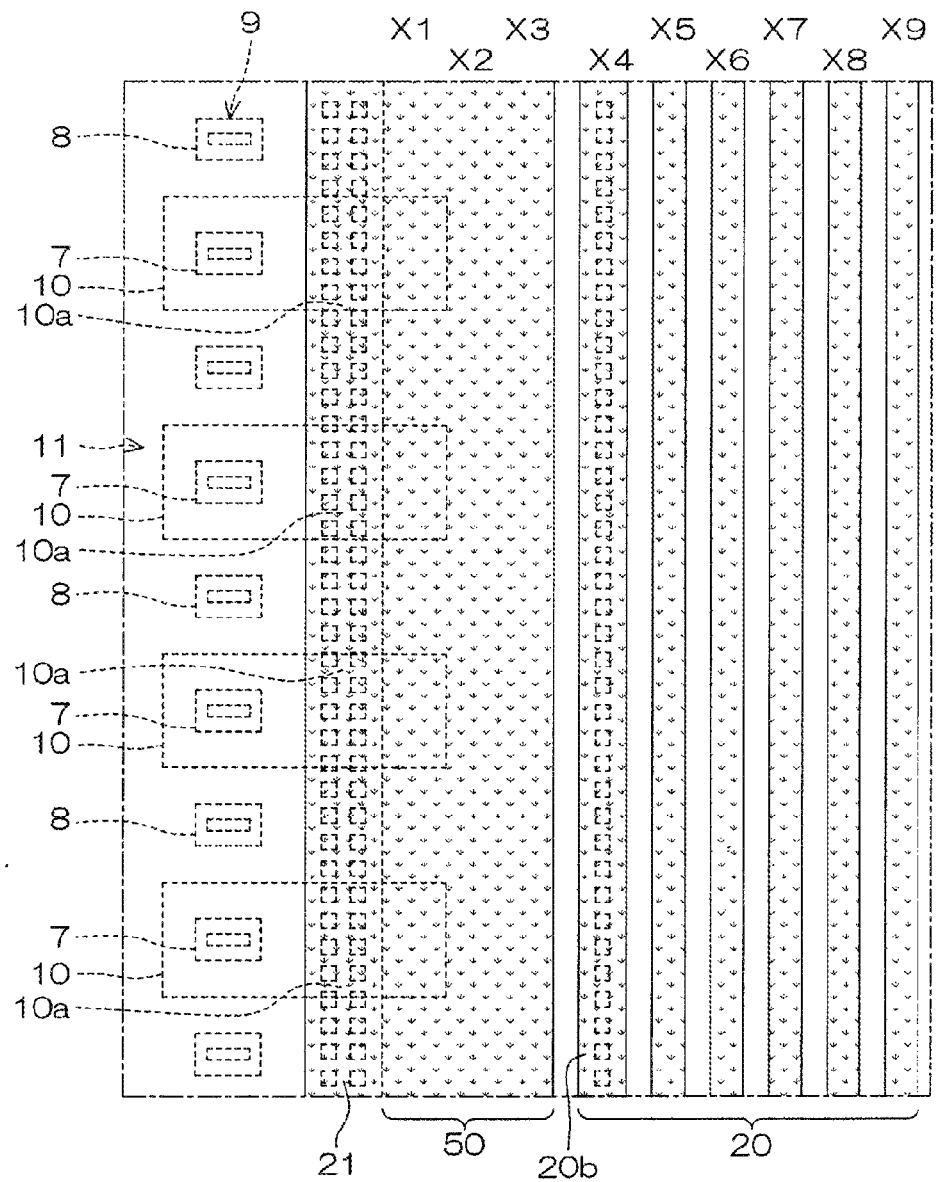
FIG. 6B illustrates a plan view of a portion corresponding to FIG. 3, showing a third adjustment example for the layout of the second ground conductor film.
Figure 6C:
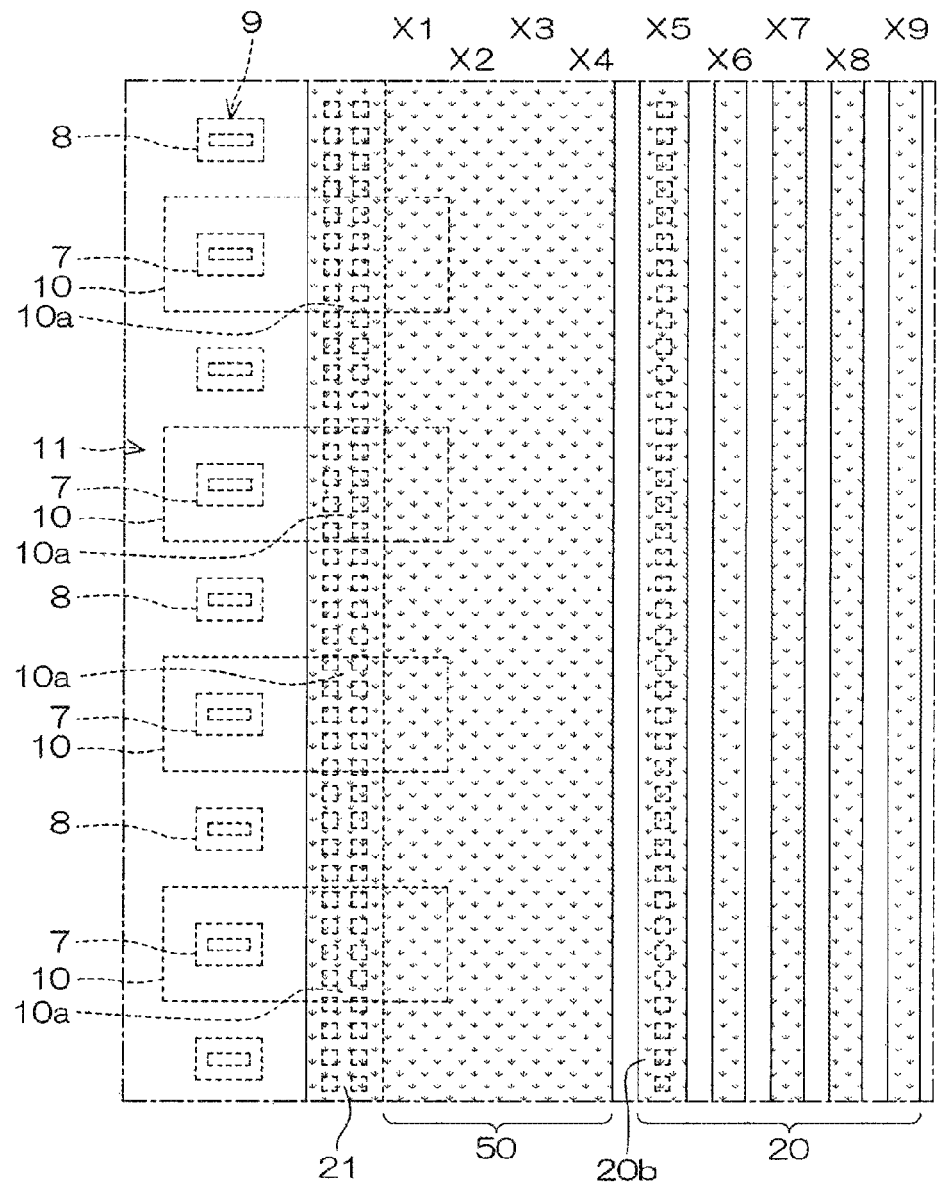
FIG. 6C illustrates a plan view of a portion corresponding to FIG. 3, showing a fourth adjustment example for the layout of the second ground conductor film.

In the present embodiment, in order to examine a relationship between the layout of the second ground conductor film 50 and the breakdown voltage of the semiconductor device 1, three semiconductor devices 1 in which the layout of the second ground conductor film 50 is changed are prepared as shown in FIGS. 6A to 6C which are plan views illustrating portions corresponding to FIG. 3, showing second to fourth adjustment examples of the layout of the second ground conductor film 50.

In the following description, in FIG. 3, a position at which the second ground conductor film 50 is disposed is referred to as a first position x1, a position at which the outermost peripheral portion 20b of the field plate 20 is disposed is referred to as a second position x2, and positions at which extending portions of the field plate 20 are arranged from the outermost peripheral portion 20b toward the innermost peripheral portion 20a of the field plate 20 in a direction orthogonal to a direction in which the field plate 20 extends are referred to as a third position x3, a fourth position x4, a fifth position x5, . . . , an eighth position x8, and a ninth position x9 in that order.

As compared to the configuration of the first adjustment example, FIG. 6A illustrates that the second adjustment example has a configuration in which the second ground conductor film 50 is drawn to the second position x2 toward the drain region 4. The field plate 20 is set to be shorter and the outermost peripheral portion 20b of the field plate 20 is disposed at the third position x3.

As compared to the configuration of the first adjustment example, FIG. 6B illustrates that the third adjustment example has a configuration in which the second ground conductor film 50 is drawn to the third position x3 toward the drain region 4. The outermost peripheral portion 20b of the field plate 20 is disposed at the fourth position x4.

As compared to the configuration of the first adjustment example, FIG. 6C illustrates that the fourth adjustment example has a configuration in which the second ground conductor film 50 is drawn to the fourth position x4 toward the drain region 4. The outermost peripheral portion 20b of the field plate 20 is disposed at the fifth position x5.

As shown in FIGS. 6A to 6C, each of the second adjustment example, the third adjustment example, and the fourth adjustment example has a configuration in which the boundary between the epitaxial layer 3 and the overhang portions 10a of the source side well regions 10 overlaps the second ground conductor film 50. In other words, the second ground conductor film 50 is drawn to the drain region 4 so as to cover the entire area of the overhang portions 10a of the source side well regions 10. In addition, the outermost peripheral portion 20b of the field plate 20 is disposed closer to the drain region 4 than the boundary between the epitaxial layer 3 and the overhang portions 10a of the source side well regions 10.

For comparison with the breakdown voltage of the semiconductor device 1 according to the first to fourth adjustment examples, four semiconductor devices 101A, 101B, 101C, and 101D are prepared as illustrated in FIGS. 7A to 7D which are enlarged plan views showing a portion of a region in which the field plate 20 is arranged in the semiconductor devices 101A to 101D according to first to fourth reference examples, respectively. FIGS. 7A to 7D are enlarged plan views of the portions corresponding to FIGS. 3 and 6A to 6C, respectively. In FIGS. 7A to 7D, the same elements and portions as those shown in FIGS. 3 and 6A to 6C are denoted by the same reference numerals, and explanation of which will not be repeated.

Figure 7A:
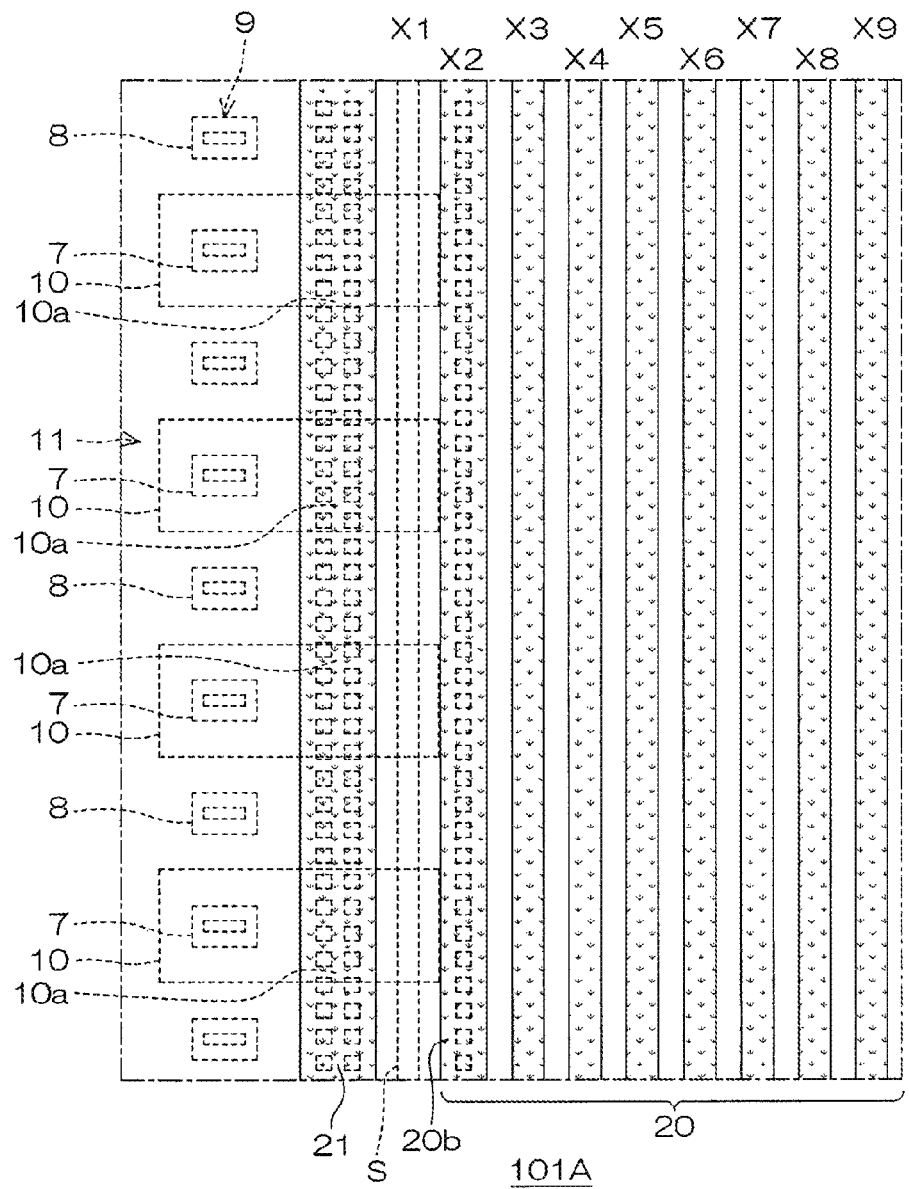
FIG. 7A illustrates a plan view of a portion corresponding to FIG. 3, showing a layout of a field plate of a semiconductor device according to a first reference example.
Figure 7B:
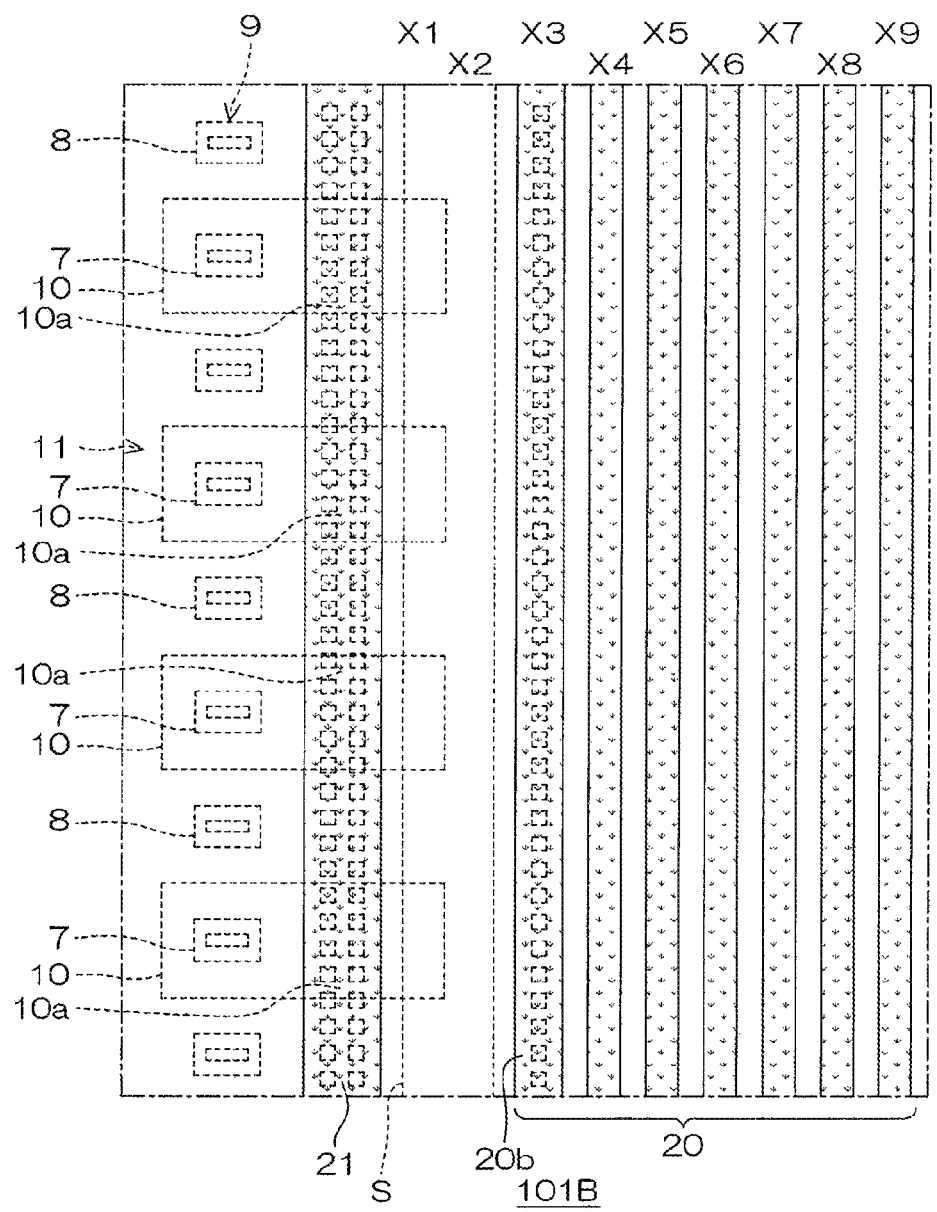
FIG. 7B illustrates a plan view of a portion corresponding to FIG. 3, showing a layout of a field plate of a semiconductor device according to a second reference example.

As shown in FIG. 7A, the semiconductor device 101A according to the first reference example has a configuration in which the second ground conductor film 50 is removed from the semiconductor device 1 (see FIG. 3) according to the above-described first adjustment example. As shown in FIG. 7B, the semiconductor device 101B according to the second reference example has a configuration in which the second ground conductor film 50 is removed from the semiconductor device 1 (see FIG. 6A) according to the above-described second adjustment example.

Figure 7C:
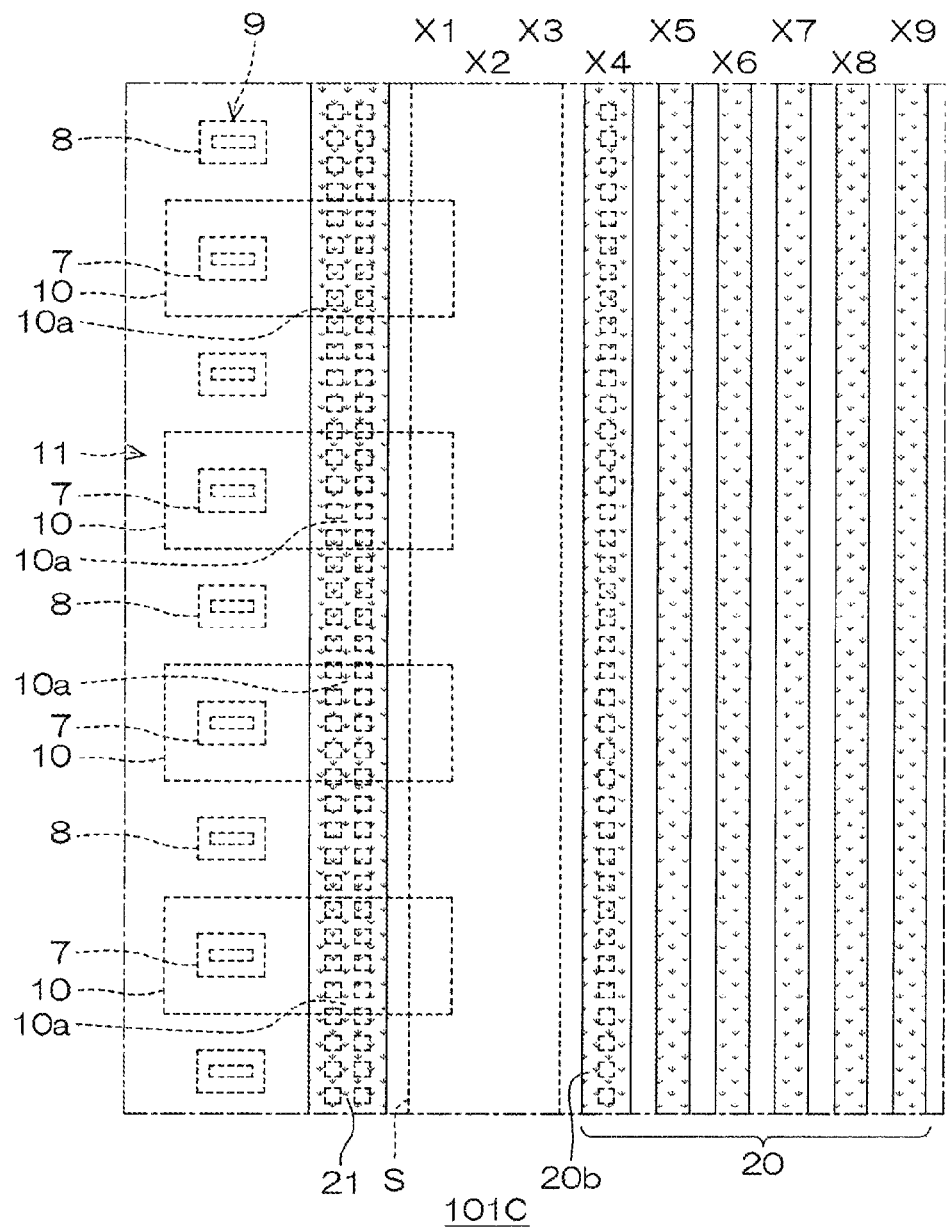
FIG. 7C illustrates a plan view of a portion corresponding to FIG. 3, showing a layout of a field plate of a semiconductor device according to a third reference example.
Figure 7D:
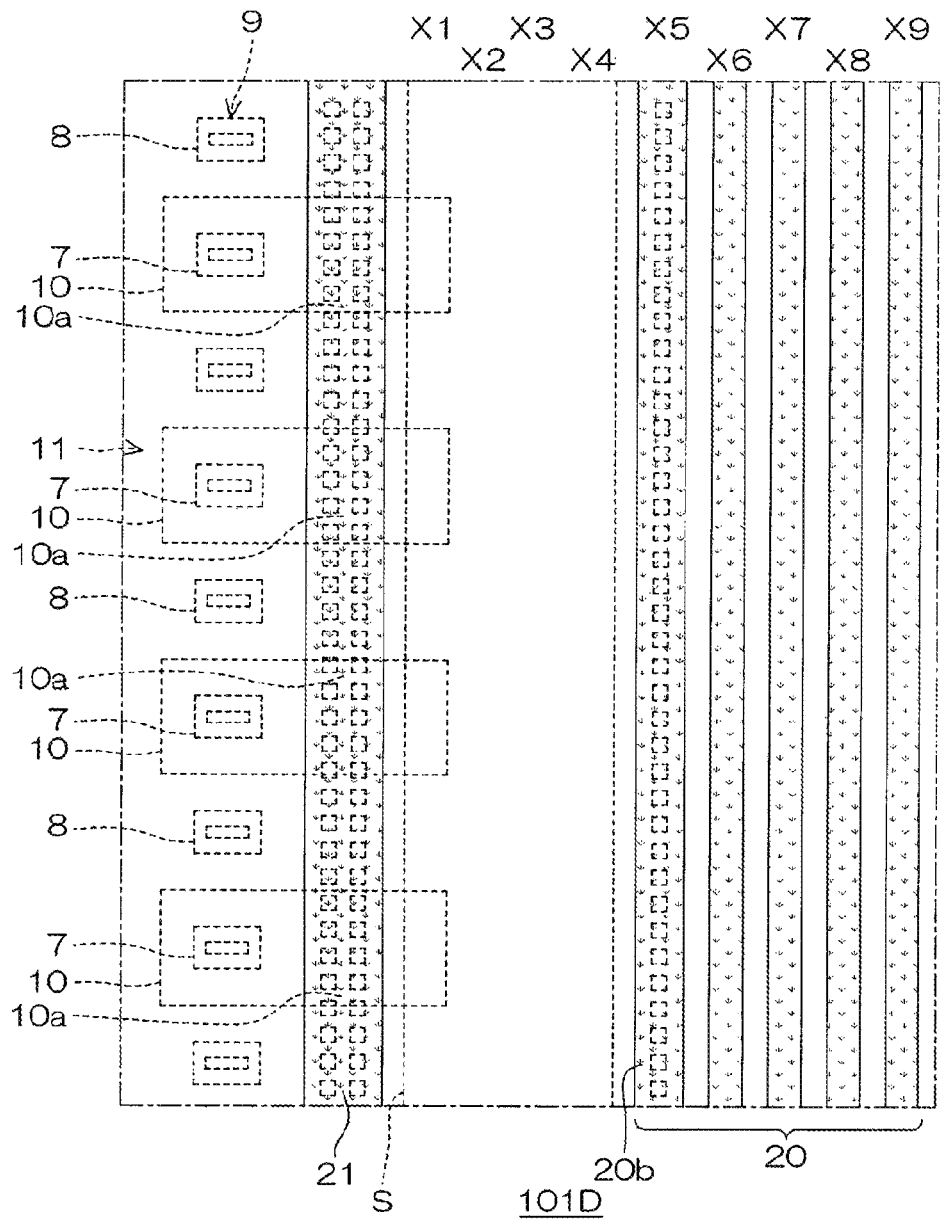
FIG. 7D illustrates a plan view of a portion corresponding to FIG. 3, showing the layout of a field plate of a semiconductor device according to a fourth reference example.

As shown in FIG. 7C, the semiconductor device 101C according to the third reference example has a configuration in which the second ground conductor film 50 is removed from the semiconductor device 1 (see FIG. 6B) according to the above-described third adjustment example. As shown in FIG. 7D, the semiconductor device 101D according to the fourth reference example has a configuration in which the second ground conductor film 50 is removed from the semiconductor device 1 (see FIG. 6C) according to the above-described fourth adjustment example.

As shown in FIGS. 7A to 7D, any of the semiconductor devices 101A to 101D according to the first to fourth reference examples has an empty region S where the second ground conductor film 50 does not exist and the overhang portions 10a of the source side well regions 10 are exposed, which is formed between the outermost peripheral ground conductor film 21 and the outermost peripheral portion 20b of the field plate 20.

Figure 8:
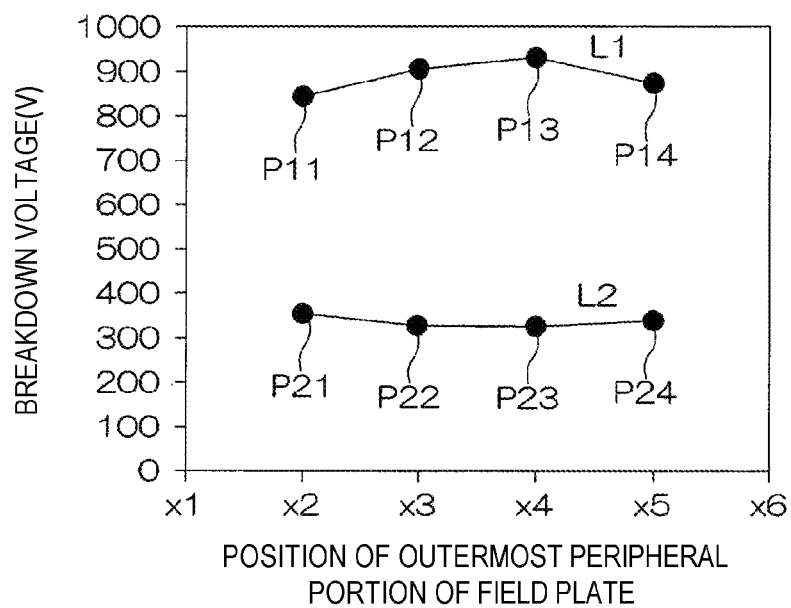
FIG. 8 is a graph showing a relationship between the layout of the second ground conductor film and a breakdown voltage of a semiconductor device.

FIG. 8 is a graph showing a relationship between the layout of the second ground conductor film 50 and the breakdown voltages of the semiconductor devices 1 and 101A to 101D. In FIG. 8, a horizontal axis indicates a position at which the outermost peripheral portion 20b of the field plate 20 is disposed and a vertical axis indicates a breakdown voltage BV (V). The breakdown voltage BV is measured by increasing a drain voltage $V_D$ from 0V to a voltage at which the semiconductor devices 1 and 101A to 101D break down.

The graph of FIG. 8 shows a first polygonal line L1 that connects four first to fourth plots P11 to P14 and a second polygonal line L2 that connects four first to fourth plots P21 to P24 are shown.

The first polygonal line L1 shows a relationship between the layout of the second ground conductor film 50 in the semiconductor device 1 according to the present embodiment and the breakdown voltage BV. The first plot P11 of the first polygonal line L1 shows the breakdown voltage of the semiconductor device 1 (see FIG. 3) according to the first adjustment example. The second plot P12 of the first polygonal line L1 shows the breakdown voltage of the semiconductor device 1 (see FIG. 6A) according to the second adjustment example. The third plot P13 of the first polygonal line L1 shows the breakdown voltage of the semiconductor device 1 (see FIG. 6B) according to the third adjustment example. The fourth plot P14 of the first polygonal line L1 shows the breakdown voltage of the semiconductor device 1 (see FIG. 6C) according to the fourth adjustment example.

On the other hand, the second polygonal line L2 shows a relationship between the layout of the field plate 20 of the semiconductor devices 101A to 101D according to the first to fourth reference examples and the breakdown voltage BV. The first plot P21 of the second polygonal line L2 shows the breakdown voltage of the semiconductor device 101A (see FIG. 7A) according to the first reference example. The second plot P22 of the second polygonal line L2 shows the breakdown voltage of the semiconductor device 101B (see FIG. 7B) according to the second reference example. The third plot P23 of the second polygonal line L2 shows the breakdown voltage of the semiconductor device 101C (see FIG. 7C) according to the third reference example. The fourth plot P24 at the second polygonal line L2 shows the breakdown voltage of the semiconductor device 101D (see FIG. 7D) according to the fourth reference example.

The second polygonal line L2 shows a result that the breakdown voltage BV is less than 400V in the semiconductor devices 101A to 101D according to the first to fourth reference examples in which the second ground conductor film 50 does not exist. It is considered that the result is caused because an electric field is concentrated in the empty region S formed between the outermost peripheral ground conductor film 21 and the outermost peripheral portion 20b of the field plate 20, and thus, the breakdown voltage BV is reduced.

In contrast, the first polygonal line L1 shows that the breakdown voltages BV of the semiconductor device 1 according to the first to fourth adjustment examples of the semiconductor device 1 in which the second ground conductor film 50 is present is equal to or higher than 800V. Therefore, the result that the breakdown voltages BV of the semiconductor devices 1 according to the first to fourth adjustment examples is higher than the breakdown voltage BV of the semiconductor devices 101A to 101D according to the first to fourth reference examples is obtained. Particularly, in the second to third adjustment examples, the breakdown voltage BV is equal to or higher than 900V, which is higher than the breakdown voltage BV of the first adjustment example.

From the above, referring to FIGS. 6A to 6C, it is understood that the boundary between the epitaxial layer 3 and the overhang portions 10a of the source side well regions 10 may be formed such that the second ground conductor film 50 covers the overhang portions 10a of the source side well regions 10 and the outermost peripheral portion 20b of the field plate 20 is disposed closer to the drain region 4 than the boundary between the overhang portions 10a of the source side well regions 10 and the epitaxial layer 3.

The first polygonal line L1 shows a result that the breakdown voltage BV is increased in the order of the first adjustment example, the second adjustment example, and the third adjustment example but the breakdown voltage BV is lower in the fourth adjustment example than the third adjustment example. As such, the third adjustment example has a maximum value of the breakdown voltage BV. It is considered that this is because, as the amount of protrusion of the second ground conductor film 50 toward the drain region 4 increases, an electric field is concentrated in the vicinity of the periphery of the second ground conductor film 50 on the side of the drain region 4, and thus, the breakdown voltage BV is decreased.

It can be seen from the graph of FIG. 8 that the semiconductor device 1 including the second ground conductor film 50 can achieve a breakdown voltage BV higher than that of the semiconductor devices 101A to 101D according to the first to fourth reference examples which do not include the second ground conductor film 50. On the other hand, it is found that the breakdown voltage BV is not increased with the increase in amount of protrusion of the second ground conductor film 50 toward the drain region 4, but an optimal value exists in the amount of protrusion of the second ground conductor film 50. Therefore, the breakdown voltage BV is expected to be further increased by optimizing the protrusion amount or separately adding a structure to alleviate the electric field concentration generated in the vicinity of the second ground conductor film 50.

As described above, according to the semiconductor device 1 of the present embodiment, further formed between the outermost peripheral ground conductor film 21 and the outermost peripheral portion 20b of the field plate 20, which have the same electric potential (e.g., ground electric potential) is the second ground conductor film 50 having an electric potential (e.g., ground electric potential), which is the same as the outermost peripheral ground conductor film 21 and the outermost peripheral portion 20b of the field plate 20. Therefore, the outermost peripheral portion 20b of the field plate 20 can be disposed at a position distant from the source/gate region 9 and a voltage drop can be prevented by the second ground conductor film 50 from occurring between the outermost peripheral portion 20b of the field plate 20 and the outermost peripheral ground conductor film 21.

Thus, it is possible to prevent the source/gate region 9 formed at the surface region of the epitaxial layer 3 from being affected by the voltage drop of the field plate 20 formed on the epitaxial layer 3. In addition, since the second ground conductor film 50 having an electric potential (e.g., ground electric potential), which is the same as the outermost peripheral portion 20b of the field plate 20 and the outermost peripheral ground conductor film 21, is interposed between the outermost peripheral portion 20b of the field plate 20 and the outermost peripheral ground conductor film 21, it is possible to prevent an electric field from being concentrated between the outermost peripheral portion 20b of the field plate 20 and the outermost peripheral ground conductor film 21. As a result, it is possible to satisfactorily deplete the source side well regions 10 and the source regions 7 by application of a control voltage to the source/gate region 9.

In addition, in the semiconductor device 1 according to the present embodiment, since the outermost peripheral portion 20b of the field plate 20 is disposed at a position avoiding the overhang portions 10a of the source side well regions 10, it is possible to satisfactorily avoid the source side well regions 10 and the source regions 7 from being affected by the voltage drop at the outermost peripheral portion 20b of the field plate 20. As a result, it is possible to more satisfactorily deplete the source side well regions 10 and the source regions 7.

In particular, in the second to fourth adjustment examples (see FIGS. 6A to 6C), not only do the boundary between the epitaxial layer 3 and the overhang portions 10a of the source side well regions 10 overlap the second ground conductor film 50, but also the second ground conductor film 50 covers the entire region of the overhang portions 10a of the source side well regions 10. Thus, it is possible to effectively avoid the source side well regions 10 and the source/gate region 9 from being affected by the voltage drop at the outermost peripheral portion 20b of the field plate 20, while an electric field is prevented from being concentrated between the outermost peripheral portion 20b of the field plate 20 and the outermost peripheral ground conductor film 21. As a result, it is possible to provide the semiconductor device 1 capable of effectively increasing the breakdown voltage.

Second Embodiment

Figure 9:
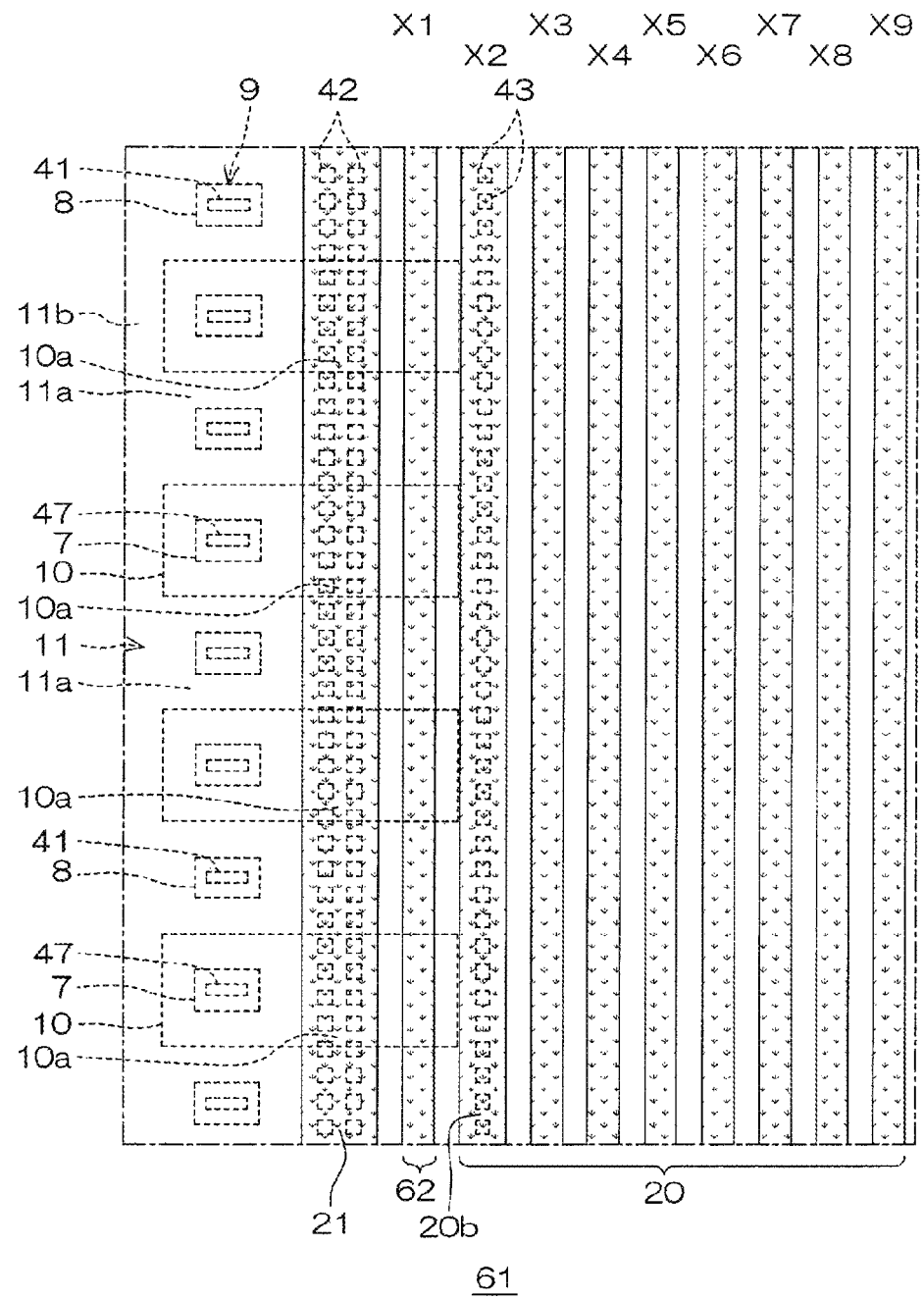
FIG. 9 illustrates a plan view of a portion in a region in which a field plate is disposed in a semiconductor device according to a second embodiment of the present disclosure, showing a first adjustment example of a layout of a floating conductor film.

FIG. 9 illustrates a plan view of a portion in a region in which the field plate 20 is disposed in a semiconductor device 61 according to a second embodiment of the present disclosure, showing a first adjustment example of a layout of a floating conductor film 62 to be described below. In addition, FIG. 9 is an enlarged plan view of a portion corresponding to FIG. 3.

The semiconductor device 61 according to the second embodiment is different from the semiconductor device 1 according to the above-described first embodiment in that, instead of the second ground conductor film 50, a floating conductor film 62 in an electrically floating state is disposed in a predetermined manner. The present embodiment involves increasing the breakdown voltage of the semiconductor device 61 by providing the floating conductor film 62. Other configurations of the semiconductor device 61 are similar to those of the above-described semiconductor device 1. In FIG. 9, the same elements and portions as those described in the first embodiment are denoted by the same reference numerals, and explanation of which will not be repeated.

As shown in FIG. 9, the floating conductor film 62 is interposed between the outermost peripheral portion 20b of the field plate 20 and the outermost peripheral ground conductor film 21 so as to be spaced from the field plate 20 and the outermost peripheral ground conductor film 21. The floating conductor film 62 is formed in an oval annular shape in a top view to surround the field plate 20. The floating conductor film 62 traverses and overlaps the overhang portions 10a of the source side well regions 10 in a top view. The floating conductor film 62 is formed to face the gate metal 31 and is capacitively-coupled with the gate metal 31.

In the above configuration, the boundary between the epitaxial layer 3 and the overhang portions 10a of the source side well regions 10 is located in a region between the inner peripheral edge of the floating conductor film 62 and the outermost peripheral portion 20b of the field plate 20. Therefore, the outermost peripheral portion 20b of the field plate 20 is disposed closer to the drain region 4 than the boundary between the epitaxial layer 3 and the overhang portions 10a of the source side well regions 10. In the present embodiment, the floating conductor film 62 does not overlap the boundary between the epitaxial layer 3 and the overhang portions 10a of the source side well regions 10. However, the floating conductor film 62 may overlap the boundary between the epitaxial layer 3 and the overhang portions 10a of the source side well regions 10.

Figure 10A:
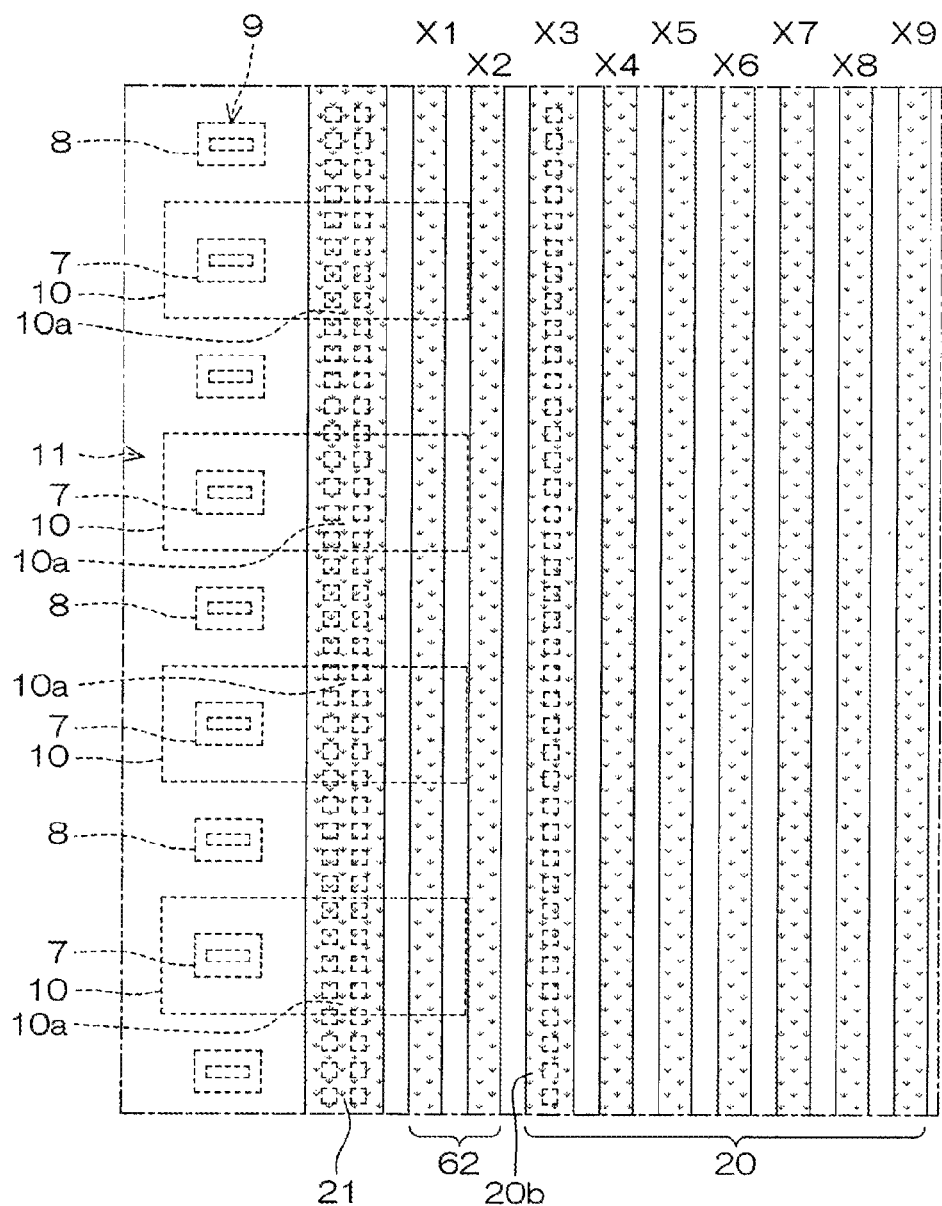
FIG. 10A illustrates a plan view of a portion corresponding to FIG. 9, showing a second adjustment example for the layout of the floating conductor film.
Figure 10B:
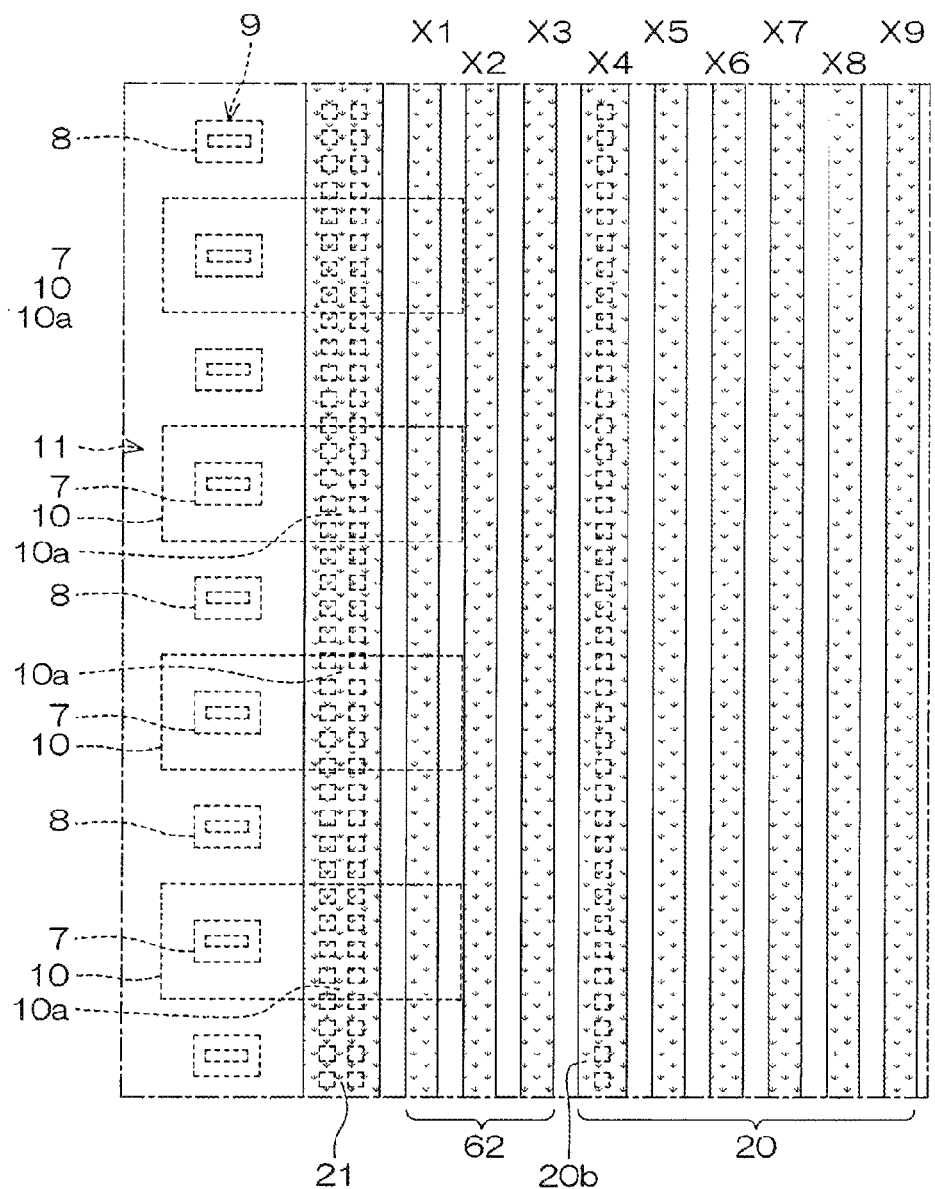
FIG. 10B illustrates a plan view of a portion corresponding to FIG. 9, showing a third adjustment example for the layout of the floating conductor film.

In the present embodiment, in order to examine a relationship between the layout of the floating conductor film 62 and the breakdown voltage of the semiconductor device 61, three semiconductor devices 61 in which the layout of the floating conductor film 62 is changed are prepared as shown in FIGS. 10A to 10C which are plan views illustrating portions corresponding to FIG. 9, showing second to fourth adjustment examples of the layout of the floating conductor film 62.

In the following description, in FIG. 9, a position at which the floating conductor film 62 is disposed is referred to as a first position x1, a position at which the outermost peripheral portion 20b of the field plate 20 is disposed is referred to as a second position x2, and positions at which extending portions of the field plate 20 are arranged from the outermost peripheral portion 20b toward the innermost peripheral portion 20a of the field plate 20 in a direction orthogonal to a direction in which the field plate 20 extends are referred to as a third position x3, a fourth position x4, a fifth position x5, . . . , an eighth position x8, and a ninth position x9 in that order.

As shown in FIG. 10A, the second adjustment example has a configuration in which one floating conductor film 62 is disposed at each of the first position x1 and the second position x2, and the outermost peripheral portion 20b of the field plate 20 is disposed at the third position x3.

As shown in FIG. 10B, the third adjustment example has a configuration in which one floating conductor film 62 is disposed at each of the first position x1, the second position x2, and the third position x3, and the outermost peripheral portion 20b of the field plate 20 is disposed at the fourth position x4.

As shown in FIG. 10C, the fourth adjustment example has a configuration in which one floating conductor film 62 is disposed at each of the first position x1, the second position x2, the third position x3, and the fourth position x4, and the outermost peripheral portion 20b of the field plate 20 is disposed at the fifth position x5.

As shown in FIGS. 10A to 10C, when a plurality of floating conductor films 62 are interposed between the outermost peripheral portion 20b of the field plate 20 and the outermost peripheral ground conductor film 21, a floating conductor film 62 having a relatively long circumferential length is disposed to surround a floating conductor film 62 having a relatively short circumferential length. The floating conductor films 62 may also be formed in a spiral shape in a top view to surround the field plate 20 between the outermost peripheral portion 20b of the field plate 20 and the outermost peripheral ground conductor film 21. In the present embodiment, each of the plurality of floating conductor films 62 is formed in an oval annular shape in a top view and concentrically surrounds the field plate 20. A pitch between adjacent floating conductor films 62 is substantially equal to a winding pitch of the field plate 20.

Figure 11:
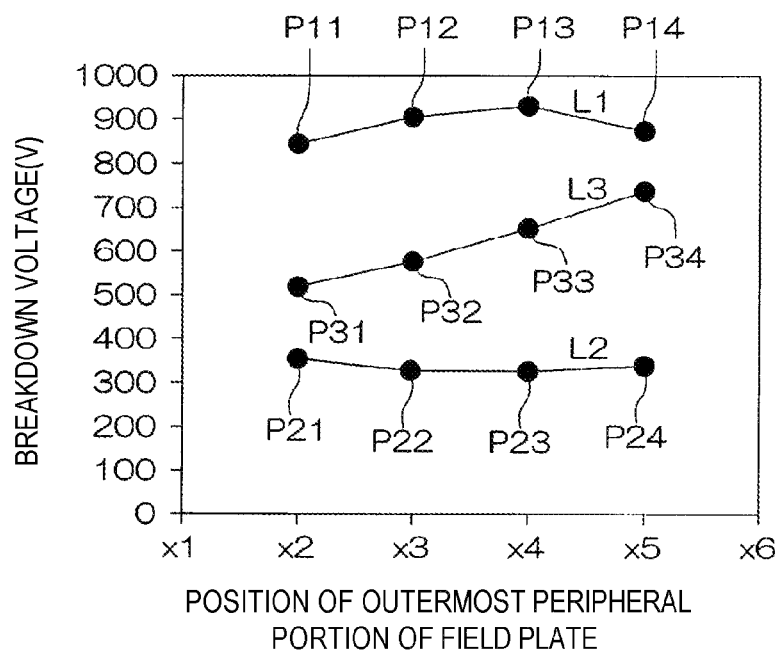
FIG. 11 is a graph showing a relationship between the layout of the floating conductor film and a breakdown voltage of a semiconductor device.

FIG. 11 is a graph showing a relationship between the layout of the floating conductor film 62 and the breakdown voltage of the semiconductor device 61. The graph of FIG. 11 is a graph corresponding to FIG. 8. In addition to the above-mentioned first and second polygonal lines L1 and L2, a third polygonal line L3 connecting four first to fourth plots P31 to P34 is shown in the graph of FIG. 11.

The third polygonal line L3 shows a relationship between the layout of the floating conductor film 62 of the semiconductor device 61 according to the present embodiment and the breakdown voltage BV. The first plot P31 of the third polygonal line L3 shows the breakdown voltage of the semiconductor device 61 (see FIG. 9) according to the first adjustment example. The second plot P32 of the third polygonal line L3 shows the breakdown voltage of the semiconductor device 61 (see FIG. 10A) according to the second adjustment example. The third plot P33 of the third polygonal line L3 shows the breakdown voltage of the semiconductor device 61 (see FIG. 10B) according to the third adjustment example. The fourth plot P34 of the third polygonal line L3 shows the breakdown voltage of the semiconductor device 61 (see FIG. 10C) according to the fourth adjustment example.

Referring to the third polygonal line L3, the breakdown voltage BV of the semiconductor device 61 according to the present embodiment is equal to or higher than 500V. Therefore, referring to the second and third polygonal lines L2 and L3, the breakdown voltage BV of the semiconductor device 61 according to the present embodiment is higher than the breakdown voltage BV of the semiconductor devices 101A to 101D according to the first to fourth reference examples.

On the other hand, referring to the first and third polygonal lines L1 and L3, the breakdown voltage BV of the semiconductor device 61 according to the present embodiment is lower than the breakdown voltage BV of the semiconductor device 1 having the second ground conductor film 50. However, in the semiconductor device 61 according to the present embodiment, the breakdown voltage BV is increased in the order of the first adjustment example, the second adjustment example, the third adjustment example, and the fourth adjustment example, unlike the above-described semiconductor device 1. That is, the breakdown voltage BV is increased with the increase in the number of floating conductor films 62. Therefore, by disposing the floating conductor films 62 at the fifth to ninth positions x5 to x9 (also see FIGS. 10A to 10C, etc.) and increasing the number of floating conductor films 62, the breakdown voltage BV is expected to be further increased.

As described above, according to the semiconductor device 61 of the present embodiment, instead of the second ground conductor film 50, the floating conductor film 62 in a floating state is interposed between the outermost peripheral portion 20b of the field plate 20 and the outermost peripheral ground conductor film 21. Even with such a floating conductor film 62, the outermost peripheral portion 20b of the field plate 20 may be disposed at a position distant from the source/gate region 9 and a voltage drop may be prevented by the floating conductor film 62 from occurring between the outermost peripheral portion 20b of the field plate 20 and the outermost peripheral ground conductor film 21.

Thus, it is possible to prevent the source/gate region 9 formed at the surface region of the epitaxial layer 3 from being affected by the voltage drop of the field plate 20 formed on the epitaxial layer 3. In addition, since the floating conductor film 62 is interposed between the outermost peripheral portion 20b of the field plate 20 and the outermost peripheral ground conductor film 21, it is possible to prevent an electric field from being concentrated between the outermost peripheral portion 20b of the field plate 20 and the outermost peripheral ground conductor film 21. As a result, it is possible to satisfactorily deplete the source side well regions 10 and the source regions 7 by application of a control voltage to the source/gate region 9.

Additionally, in the semiconductor device 61 according to the present embodiment, since the outermost peripheral portion 20b of the field plate 20 is disposed at a position avoiding the overhang portions 10a of the source side well regions 10, it is possible to satisfactorily avoid the source side well regions 10 and the source regions 7 from being affected by the voltage drop at the outermost peripheral portion 20b of the field plate 20. As a result, it is possible to more satisfactorily deplete the source side well regions 10 and the source regions 7.

Further, in the second to fourth adjustment examples (see FIGS. 10A to 10C), a plurality of floating conductor films 62 are interposed between the outermost peripheral portion 20b of the field plate 20 and the outermost peripheral ground conductor film 21. Thus, it is possible to effectively avoid the source side well regions 10 and the source/gate region 9 from being affected by the voltage drop at the outermost peripheral portion 20b of the field plate 20, while preventing an electric field from being concentrated between the outermost peripheral portion 20b of the field plate 20 and the outermost peripheral ground conductor film 21. As a result, it is possible to provide the semiconductor device 61 capable of effectively increasing the breakdown voltage.

Although the embodiments of the present disclosure are described above, the present disclosure may be implemented with other embodiments.

Figure 12:
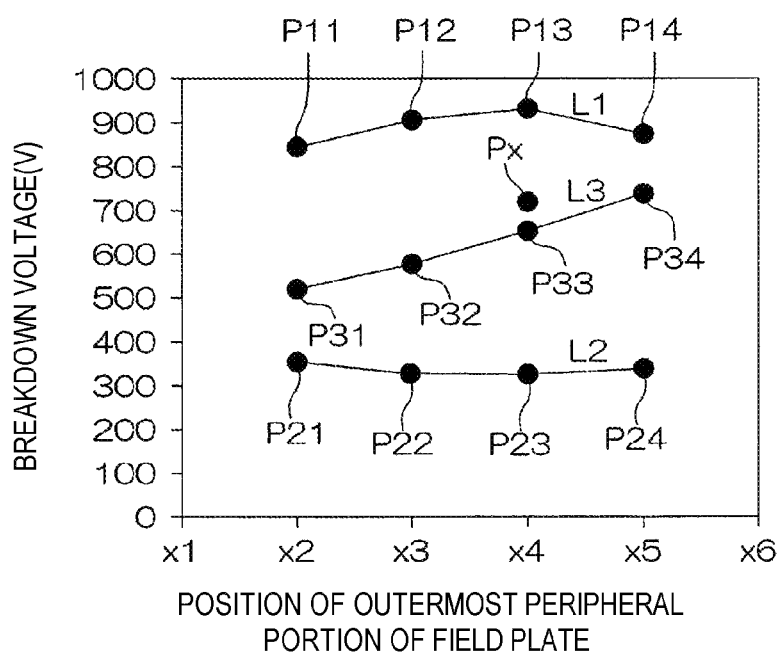
FIG. 12 is a graph showing characteristics of a breakdown voltage when the floating conductor film shown in FIG. 10B is replaced with second ground conductor films.

For instance, examples in which one or more floating conductor films 62 are formed in the first to fourth adjustment examples are described in the above-described second embodiment. However, one or more second ground conductor films 50 formed separately from the outermost peripheral ground conductor film 21 may be used by electrically connecting the floating conductor films 62 to ground, for example, via a contact and the gate metal 31. FIG. 12 shows characteristics of the breakdown voltage BV when the three floating conductor films 62 shown in the third adjustment example of the second embodiment are used as three second ground conductor films 50.

FIG. 12 is a graph showing the characteristics of the breakdown voltage BV when the three floating conductor films 62 shown in FIG. 10B are replaced with three second ground conductor films 50. FIG. 12 is a graph corresponding to FIGS. 8 and 11. In FIG. 12, the breakdown voltage BV when the floating conductor films 62 shown in FIG. 10B are replaced with the second ground conductor films 50 is indicated by a plot Px. The above-mentioned first to third polygonal lines L1, L2, and L3 are also shown in FIG. 12.

As shown in FIG. 12, when the floating conductor films 62 shown in FIG. 10B are replaced with the second ground conductor films 50, the breakdown voltage BV in that case is equal to or higher than 700V, which is higher than the breakdown voltage BV (=400V or lower) of the semiconductor devices 101A to 101D according to the first to fourth reference examples. In this manner, it is found that the breakdown voltage BV can be increased even when the floating conductor films 62 are replaced with the second ground conductor films 50. Therefore, one or more second ground conductor films 50 may be formed between the outermost peripheral portion 20b of the field plate 20 and the outermost peripheral ground conductor film 21 on the epitaxial layer 3 (or the outer LOCOS film 14).

Further, as shown in FIG. 13, a combination of the configuration of the above-described first embodiment and the configuration of the above-described second embodiment may be adopted. FIG. 13 illustrates an enlarged plan view of a portion in a region in which the field plate 20 is disposed in a semiconductor device 71 according to a modification example. In FIG. 13, the same elements and portions as those of the above-described first and second embodiments are denoted by the same reference numerals and explanation of which will not be repeated.

As shown in FIG. 13, the semiconductor device 71 according to the modification example has a configuration in which both of the second ground conductor film 50 and the floating conductor film 62 are interposed between the outermost peripheral portion 20b of the field plate 20 and the outermost peripheral ground conductor film 21. The second ground conductor film 50 is disposed on the side of the outermost peripheral ground conductor film 21 and the floating conductor film 62 is disposed on the side of the outermost peripheral portion 20b of the field plate 20.

FIG. 13 shows an example in which the second ground conductor film 50 is formed integrally with the outermost peripheral ground conductor film 21 along an inner periphery of the outermost peripheral ground conductor film 21. In this configuration, as shown in FIGS. 6A to 6C, the second ground conductor film 50 may be configured to cover the entire area of the overhang portions 10a of the source side well regions 10.

FIG. 13 shows an example in which the second ground conductor film 50 is formed integrally with the outermost peripheral ground conductor film 21 along the inner periphery of the outermost peripheral ground conductor film 21. However, the second ground conductor film 50 may be formed separately from the outermost peripheral ground conductor film 21. In this case, a plurality of second ground conductor films 50 may be interposed between the outermost peripheral portion 20b of the field plate 20 and the floating conductor film 62.

In addition, FIG. 13 shows an example in which two floating conductor films 62 are interposed between the second ground conductor film 50 and the outermost peripheral portion 20b of the field plate 20. However, fewer or more floating conductor films 62 may be interposed between the second ground conductor film 50 and the outermost peripheral portion 20b of the field plate 20.

In addition, in FIG. 13, the example is an illustration in which the second ground conductor film 50 and the floating conductor films 62 are interposed between the outermost peripheral portion 20b of the field plate 20 and the outermost peripheral ground conductor film 21 in this order from the outermost peripheral ground conductor film 21. However, the floating conductor films 62 and the second ground conductor film 50 may be interposed between the outermost peripheral portion 20b of the field plate 20 and the outermost peripheral ground conductor film 21 in this order from the outermost peripheral ground conductor film 21.

Further, an example in which various semiconductor regions, the LOCOS film 12, and the like are formed with a layout in an oval shape or an oval annular shape in a top view is described in each of the above-described embodiments. However, instead of an oval shape or an oval annular shape in a top view, various semiconductor regions, the LOCOS film 12, and the like may be formed with a layout in a circular shape, an annular shape, a polygonal shape (square or hexagonal shape) or a polygonal annular shape (square annular or hexagonal annular shape) in a top view.

Further, an example in which the LOCOS film 12 is formed at the surface of the epitaxial layer 3 is described in each of the above-described embodiments. However, instead of the LOCOS film 12, an STI (Shallow Trench Isolation) may be formed at the surface of the epitaxial layer 3. The STI includes a trench formed by digging down the epitaxial layer 3, and an insulator (silicon oxide, silicon nitride or the like) buried in the trench.

Further, in each of the above-described embodiments, a configuration in which the conductivity types of various semiconductor regions are inverted may be adopted. That is, the p-type portion and the n-type portion are exchangeable.

The above-described semiconductor devices 1, 61, and 71 may be incorporated in a power module used for an inverter circuit for driving an electric motor, which is used as a power source, for example, for automobiles (including electric vehicles), trains, industrial robots, air conditioners, air compressors, fans, vacuum cleaners, dryers, refrigerators. Further, the above-described semiconductor devices 1, 61, and 71 may be incorporated in a power module used for an inverter circuit of solar cells, wind power generators and other power generators, as well as a circuit module constituting an analog control power supply, a digital control power supply, etc.

Besides, it is possible to make various changes in design within the scope of the subject matters set forth in the claims.

According to some embodiments of the present disclosure, further interposed between the outermost peripheral ground conductor film and the outermost peripheral portion of the field plate which have the same potential, which have the same electric potential (e.g., ground electric potential) is the second ground conductor film having an electric potential, which is the same as the outermost peripheral ground conductor film and the outermost peripheral portion of the field plate. Therefore, the outermost peripheral portion of the field plate can be disposed at a position distant from the source region and a voltage drop can be prevented by the second ground conductor film from occurring between the outermost peripheral portion of the field plate and the outermost peripheral conductive film.

Thus, it is possible to prevent the source/gate region formed at the semiconductor layer from being affected by a voltage drop of the field plate formed on the semiconductor layer, and an electric field can be prevented by the second ground conductor film from being concentrated between the outermost peripheral portion of the field plate and the outermost peripheral ground conductor film. As a result, since the source region can be satisfactorily depleted by application of a control voltage to the source/gate region, it is possible to provide a semiconductor device capable of effectively increasing the breakdown voltage.

In addition, according to the present disclosure in some embodiments, a floating conductor film in an electrically floating state is interposed between the outermost peripheral portion of the field plate and the outermost ground conductor film. Even with such a floating conductive film, the outermost peripheral portion of the field plate can be disposed at a position distant from the source region and a voltage drop can be prevented from occurring between the outermost peripheral portion of the field plate and the outermost peripheral conductor film.

Thus, it is possible to prevent the source/gate region formed at the semiconductor layer from being affected by a voltage drop of the field plate formed on the semiconductor layer, and an electric field can be prevented by the floating conductor film from being concentrated between the outermost peripheral portion of the field plate and the outermost peripheral ground conductor film. As a result, since the source region can he satisfactorily depleted by application of a control voltage to the source/gate region, it is possible to provide a semiconductor device capable of effectively increasing the breakdown voltage.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a semiconductor substrate of a first conductivity type;
   a semiconductor layer of a second conductivity type, which is formed on the semiconductor substrate;
   a drain region of the second conductivity type, which is formed at a surface region of the semiconductor layer;
   a source/gate region including a source region of the second conductivity type and a gate region of the first conductivity type, which are alternatively arranged so as to be electrically connected to each other at the surface region of the semiconductor layer, the source/gate region being formed around the drain region at a distance so as to surround the drain region;
   a resistive field plate disposed on the semiconductor layer between the drain region and the source/gate region and spirally wound a plurality of times in a top view, the field plate including an innermost peripheral portion electrically connected to the drain region and an outermost peripheral portion electrically connected to ground;
   an outermost peripheral ground conductor film disposed on the semiconductor layer between the outermost peripheral portion of the field plate and the source/gate region so as to surround the field plate, the outermost peripheral ground conductor film being electrically connected to ground and having an annular shape in a top view; and
   a second ground conductor film disposed on the semiconductor layer between the outermost peripheral portion of the field plate and the outermost peripheral ground conductor film so as to surround the field plate, the second ground conductor film being electrically connected to ground and having an annular shape in a top view.

2. The semiconductor device of claim 1, wherein the second ground conductor film is formed integrally with the outermost peripheral ground conductor film along an inner periphery of the outermost peripheral ground conductor film between the outermost peripheral portion of the field plate and the outermost peripheral ground conductor film on the semiconductor layer.

3. The semiconductor device of claim 1, further comprising at least one additional ground conductor film electrically connected to ground,
   wherein the second ground conductor film and the additional ground conductor film are concentrically interposed between the outermost peripheral portion of the field plate and the outermost peripheral ground conductor film on the semiconductor layer.

4. The semiconductor device of claim 1, further comprising:
   a gate side well region of the first conductivity type, which is formed at the surface region of the semiconductor layer below the gate region and has an impurity concentration lower than an impurity concentration of the gate region; and
   a source side well region of the second conductivity type, which is formed at the surface region of the semiconductor layer below the source region and has an impurity concentration lower than an impurity concentration of the source region, the source side well region having an overhang portion protruding from the gate side well region toward the drain region,
   wherein the second ground conductor film overlaps the overhang portion of the source side well region in a top view.

5. The semiconductor device of claim 4, wherein a boundary between the semiconductor layer and the overhang portion of the source side well region overlaps the second ground conductor film.

6. The semiconductor device of claim 4, wherein the outermost peripheral portion of the field plate is located closer to the drain region than a boundary between the semiconductor layer and the overhang portion of the source side well region.

7. The semiconductor device of claim 1, further comprising an insulating film formed between the drain region and the source/gate region on the semiconductor layer,
   wherein the field plate, the outermost peripheral ground conductor film, and the second ground conductor film are formed on the insulating film.

8. The semiconductor device of claim 1, where the field plate, the outermost peripheral ground conductor film, and the second ground conductor film include polysilicon to which conductivity is imparted.

9. A semiconductor device comprising:
   a semiconductor substrate of a first conductivity type;
   a semiconductor layer of a second conductivity type, which is formed on the semiconductor substrate;
   a drain region of the second conductivity type, which is formed at a surface region of the semiconductor layer;
   a source/gate region including a source region of the second conductivity type and a gate region of the first conductivity type, which are alternatively arranged so as to be electrically connected to each other at the surface region of the semiconductor layer, the source/gate region being formed around the drain region at a distance so as to surround the drain region;
   a resistive field plate disposed on the semiconductor layer between the drain region and the source/gate region and spirally wound a plurality of times in a top view, the field plate including an innermost peripheral portion electrically connected to the drain region and an outermost peripheral portion electrically connected to ground;
   an outermost peripheral ground conductor film disposed on the semiconductor layer between the outermost peripheral portion of the field plate and the source/gate region so as to surround the field plate, the outermost peripheral ground conductor film being electrically connected to ground and having an annular shape in a top view; and
   a floating conductor film disposed on the semiconductor layer between the outermost peripheral portion of the field plate and the outermost peripheral ground conductor film so as to surround the field plate, the floating conductor film being in an electrically floating state and having an annular shape in a top view.

10. The semiconductor device of claim 9, further comprising at least one additional floating conductor film in an electrically floating state,
  wherein the floating conductor films are concentrically interposed between the outermost peripheral portion of the field plate and the outermost peripheral ground conductor film on the semiconductor layer.

11. The semiconductor device of claim 9, further comprising:
  a gate side well region of the first conductivity type, which is formed at the surface region of the semiconductor layer below the gate region and has an impurity concentration lower than an impurity concentration of the gate region; and
  a source side well region of the second conductivity type, which is formed at the surface region of the semiconductor layer below the source region and has an impurity concentration lower than an impurity concentration of the source region, the source side well region having an overhang portion protruding from the gate side well region toward the drain region,
  wherein the floating conductor film overlaps the overhang portion of the source side well region when viewed from top.

12. The semiconductor device of claim 11, wherein the outermost peripheral portion of the field plate is located closer to the drain region than a boundary between the semiconductor layer and the overhang portion of the source side well region.

* * * * *